(12) United States Patent
Yoo

(10) Patent No.: US 10,096,479 B2
(45) Date of Patent: Oct. 9, 2018

(54) METHOD OF FABRICATING SEMICONDUCTOR DEVICE

(71) Applicant: Samsung Electronics Co., Ltd., Suwon-si (KR)

(72) Inventor: Seunghan Yoo, Seongnam-si (KR)

(73) Assignee: SAMSUNG ELECTRONICS CO., LTD., Samsung-ro, Yeongtong-gu, Suwon-si, Gyeonggi-do (KR)

(*) Notice: Subject to any disclaimer, the term of this patent is extended or adjusted under 35 U.S.C. 154(b) by 0 days.

(21) Appl. No.: 15/395,479

(22) Filed: Dec. 30, 2016

(65) Prior Publication Data

US 2017/0110325 A1  Apr. 20, 2017

Related U.S. Application Data

(62) Division of application No. 14/726,609, filed on Jun. 1, 2015, now Pat. No. 9,576,813.

(30) Foreign Application Priority Data

Jul. 16, 2014 (KR) .................. 10-2014-0089745

(51) Int. Cl.
*H01L 21/311* (2006.01)
*H01L 21/306* (2006.01)
*H01L 21/308* (2006.01)
*H01L 29/66* (2006.01)
*H01L 21/8234* (2006.01)

(52) U.S. Cl.
CPC ........ *H01L 21/306* (2013.01); *H01L 21/3085* (2013.01); *H01L 21/823431* (2013.01); *H01L 21/823456* (2013.01); *H01L 29/66553* (2013.01)

(58) Field of Classification Search
CPC .............. H01L 21/306; H01L 21/3086; H01L 21/823468; H01L 21/823864; H01L 29/66553; H01L 29/6656
USPC .................. 438/696, 717, 718, 736, 737
See application file for complete search history.

(56) References Cited

U.S. PATENT DOCUMENTS

| | | | |
|---|---|---|---|
| 8,227,354 B2 | 7/2012 | Kim et al. | |
| 8,450,833 B2 | 5/2013 | Kim | |
| 8,645,877 B2 | 2/2014 | Hsu et al. | |
| 9,209,038 B2* | 12/2015 | Cantone | H01L 21/823431 |
| 2012/0156883 A1 | 6/2012 | Choi | |
| 2012/0205750 A1 | 8/2012 | Sudo | |
| 2012/0295441 A1 | 11/2012 | Hong | |
| 2013/0143372 A1* | 6/2013 | Kim | H01L 21/3081 438/163 |
| 2014/0024209 A1 | 1/2014 | Jung et al. | |
| 2014/0138800 A1* | 5/2014 | He | H01L 29/02 257/632 |
| 2014/0273441 A1* | 9/2014 | Kim | H01L 21/283 438/666 |
| 2015/0064907 A1* | 3/2015 | Sel | H01L 21/0337 438/694 |
| 2015/0115418 A1* | 4/2015 | Wei | H01L 21/3086 257/639 |
| 2015/0170973 A1* | 6/2015 | Kim | H01L 21/823821 438/702 |

(Continued)

*Primary Examiner* — Binh X Tran
(74) *Attorney, Agent, or Firm* — Muir Patent Law, PLLC

(57) ABSTRACT

Provided is a method of fabricating a semiconductor device. In the method, a double patterning technology is used to form various patterns with different widths.

6 Claims, 54 Drawing Sheets

(56) References Cited

U.S. PATENT DOCUMENTS

2015/0255299 A1* 9/2015 Cantone ............. H01L 21/3086
438/702

* cited by examiner

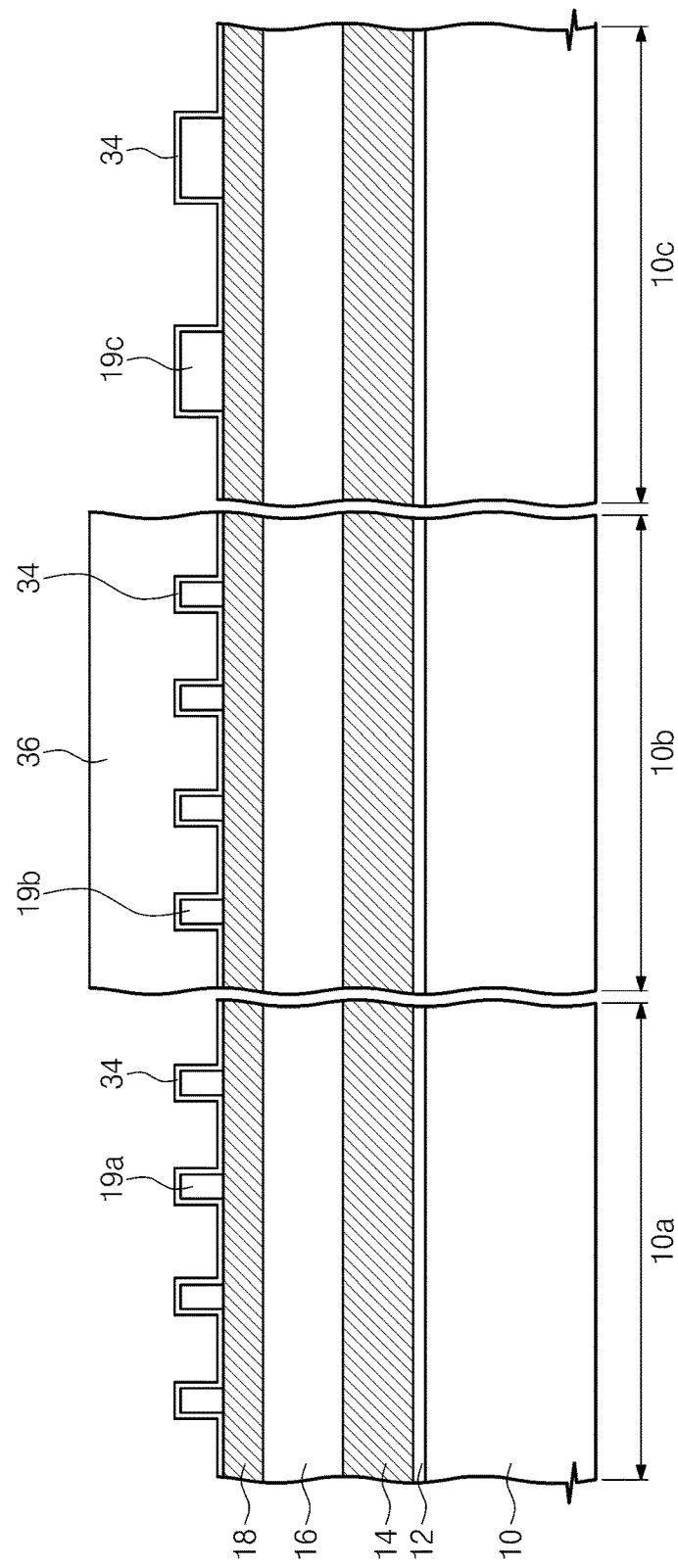

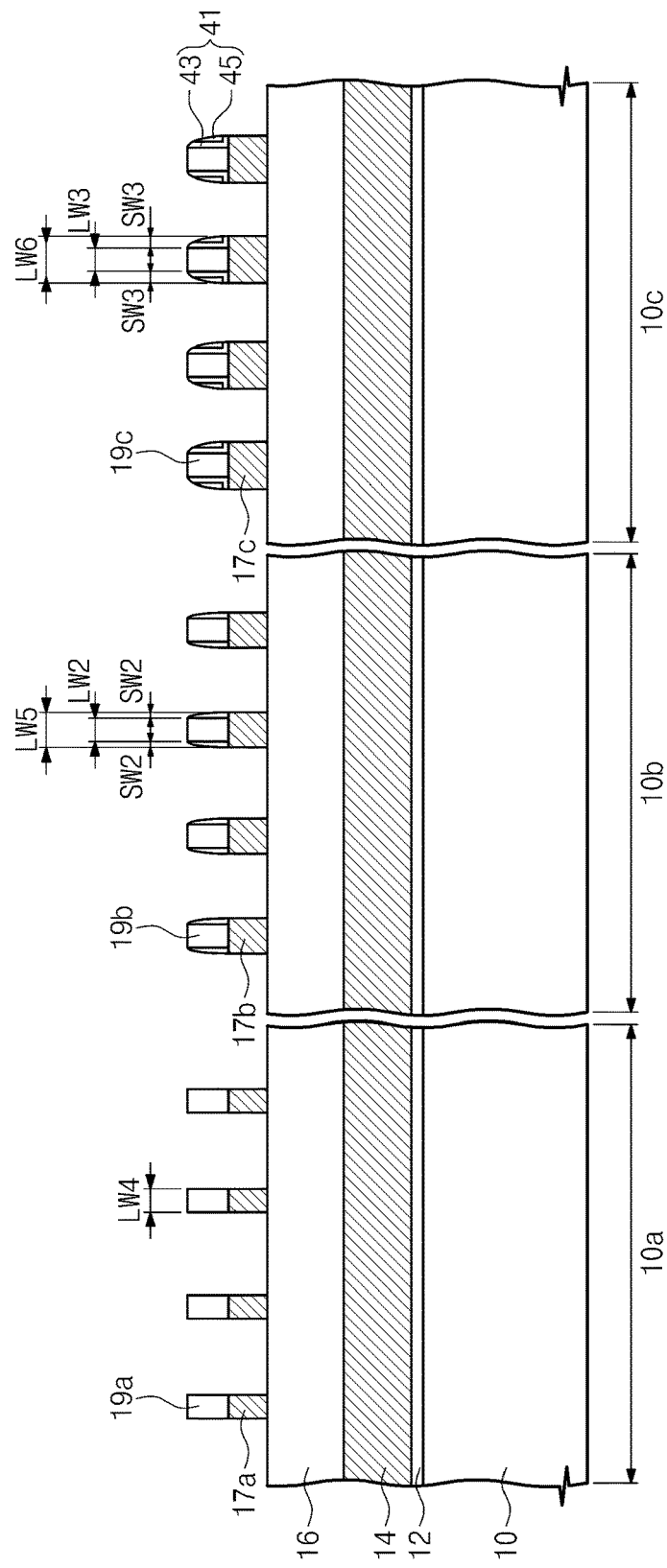

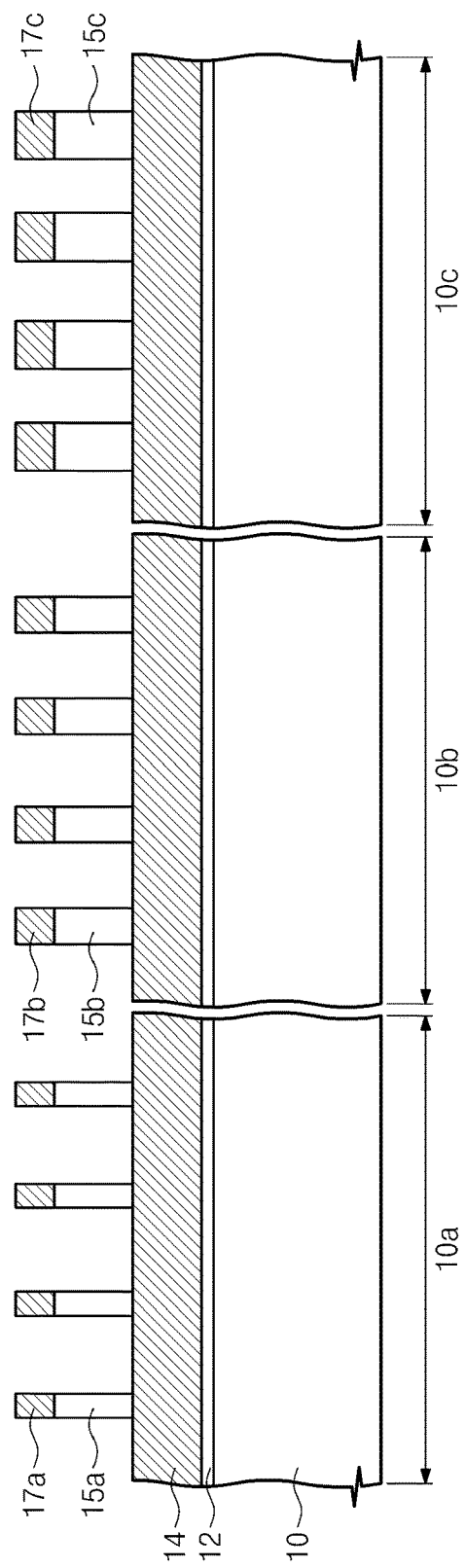

METHOD OF FABRICATING SEMICONDUCTOR DEVICE

CROSS-REFERENCE TO RELATED APPLICATIONS

This U.S. non-provisional patent application is a divisional of U.S. patent application Ser. No. 14/726,609, entitled "METHOD OF FABRICATING SEMICONDUCTOR DEVICE," filed Jun. 1, 2015, now U.S. Pat. No. 9,576,813 B2, which claims priority under 35 U.S.C. § 119 to Korean Patent Application No. 10-2014-0089745, filed Jul. 16, 2014, in the Korean Intellectual Property Office, the entire contents of both of which are hereby incorporated by reference.

BACKGROUND OF THE INVENTION

Example embodiments of the present disclosure relate to a method of fabricating a semiconductor device, and in particular, to a method of fabricating a semiconductor device using a double pattering technology.

As a design rule of a semiconductor device decreases, it may be necessary to form fine patterns, allowing for the realization of highly-integrated semiconductor devices. For example, a double patterning technology (DPT) may be used to form a fine pattern, whose dimension can be smaller than the minimum feature size that can be achieved by a photolithography process. There is a difference in desired function and property between various semiconductor devices, and thus, it is useful to develop a double patterning technology capable of forming fine patterns with different widths.

SUMMARY

Example embodiments of the inventive concept provide a method of fabricating a semiconductor device, in which patterns with different widths are provided.

According to example embodiments of the inventive concept, a method of fabricating a semiconductor device includes: sequentially forming a buffer layer and an upper layer on a substrate; forming first and second sacrificial patterns on the upper layer; forming a first spacer on a sidewall of the first sacrificial pattern and a second spacer on a sidewall of the second sacrificial pattern; selectively removing the first and second sacrificial patterns; etching the upper layer exposed by the first and second spacers to form first and second upper patterns under the first and second spacers; removing the first and second spacers to expose top surfaces of the first and second upper patterns; forming a third spacer on a sidewall of the second upper pattern; and etching the buffer layer to form first and second buffer patterns, wherein the first buffer pattern is formed under the first upper pattern using the first upper pattern as an etch mask, and the second buffer pattern is formed under the second upper pattern and the third spacer using the second upper pattern and the third spacer as an etch mask, wherein the second buffer pattern is formed to have a width larger than that of the first buffer pattern.

According to another embodiment, a method of fabricating a semiconductor device includes: sequentially forming a lower layer and an upper layer on a substrate; forming, on the upper layer, a first set of sacrificial patterns at a first region of the substrate and a second set of sacrificial patterns at a second region of the substrate; forming first spacers on sidewalls of the first sacrificial patterns and second spacers on sidewalls of the second sacrificial patterns; selectively removing the first set of sacrificial patterns and the second set of sacrificial patterns; etching the upper layer exposed by the first and second spacers to form a first set of upper patterns and a second set of upper patterns under the respective first spacers and second spacers; removing the first spacers and second spacers to expose top surfaces of the first and second upper patterns; forming third spacers on sidewalls of the first set of second upper patterns, wherein each pattern of the first upper patterns has a first width, and each pattern of the second upper patterns and its corresponding third spacers has a second width greater than the first width; and etching the lower layer to form a first set of lower patterns at the first region and a second set of lower patterns at the second region. Each pattern of the first set of lower patterns may have the first width, and each pattern of the second set of lower patterns may have the second width.

According to other embodiments, a method of fabricating a semiconductor device includes: sequentially forming a lower layer and an upper layer on a substrate; forming, on the upper layer, a first set of sacrificial patterns at a first region of the substrate and a second set of sacrificial patterns at a second region of the substrate; forming first spacers on opposite sidewalls of each of the first sacrificial patterns and second spacers on opposite sidewalls of each of the second sacrificial patterns; selectively removing the first set of sacrificial patterns and the second set of sacrificial patterns without removing the first or second spacers; etching the upper layer exposed by the first and second spacers to form a first set of upper patterns and a second set of upper patterns under the respective first spacers and second spacers; removing the first spacers and second spacers to expose top surfaces of the first and second upper patterns; forming third spacers on opposite sidewalls of each second upper pattern of the first set of second upper patterns, wherein each pattern of the first upper patterns has a first width, and each pattern of the second upper patterns and its corresponding third spacers has a second width greater than the first width; and using the first upper patterns to form first fins on the substrate, the first fins having the first width, and using the second upper patterns and corresponding third spacers to form second fins on the substrate, the second fins having the second width.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 3A through 6A are plan views illustrating a process of fabricating a semiconductor device using a fabrication method according to example embodiments of the inventive concept.

FIGS. 3B through 6B are diagrams, each of which has vertical sections taken along lines I-I', II-II', and III-III' and of FIGS. 3A through 6A, according to example embodiments.

FIGS. 3C through 6C are diagrams, each of which has vertical sections taken along lines IV-IV', V-V', and VI-VI' of FIGS. 3A through 6A, according to example embodiments.

FIGS. 7A through 7J are sectional views illustrating a method of fabricating a semiconductor device according to other example embodiments of the inventive concept.

Figure 1A:
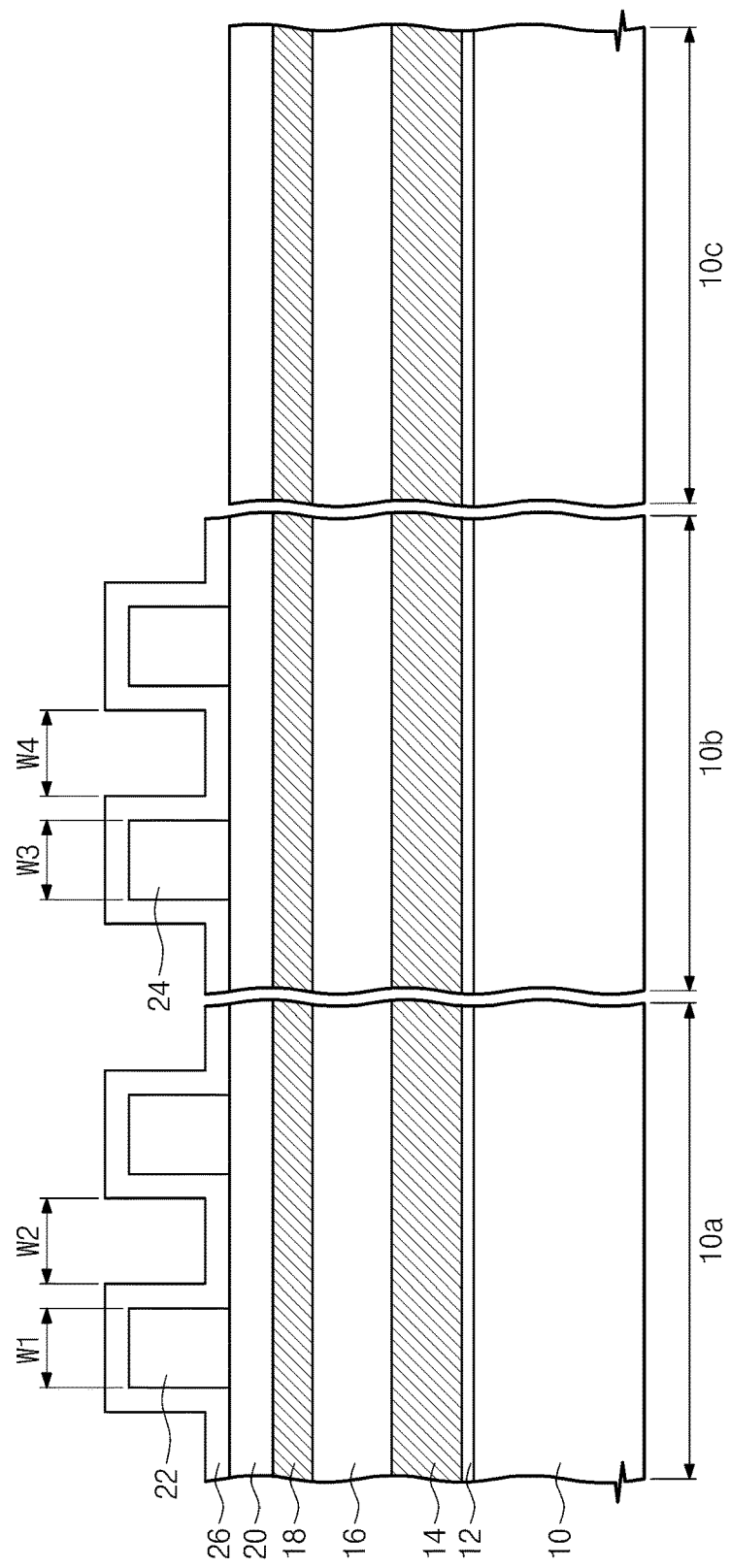
FIGS. 1A through 1O are sectional views illustrating a method of fabricating a semiconductor device according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as limiting the range of values or properties encompassed by example embodiments. For example, the relative thicknesses and positioning of layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. Other words used to describe the relationship between elements or layers should be interpreted in a like fashion (e.g., "between" versus "directly between," "adjacent" versus "directly adjacent," "on" versus "directly on"). However, the term "contact," as used herein refers to direct contact (i.e., touching) unless the context indicates otherwise.

As used herein the term "and/or" includes any and all combinations of one or more of the associated listed items. It will be understood that, although the terms "first", "second", etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIGS. 1A through 1O are sectional views illustrating a method of fabricating a semiconductor device according to example embodiments of the inventive concept.

As used herein, a semiconductor device may refer to any of the various devices such as shown in the various figures, and may also refer, for example, to two transistors or a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, memory card, hard drive including additional components, or a mobile phone, laptop, tablet, desktop, camera, or other consumer electronic device, etc.

Referring to FIG. 1A, a substrate 10 may include a first region 10a, a second region 10b, and a third region 10c. For example, the first region 10a may be a logic region, on which logic devices are provided, the second region 10b may be an SRAM region, on which SRAM cells are provided, and the third region 10c may be an I/O region, on which I/O circuits are provided.

An insulating layer 12, a conductive layer 14, a lower etch stop layer 16, a buffer layer 18, and an upper etch stop layer 20 may be sequentially formed on the substrate 10. The insulating layer 12 may be, for example, an oxide layer or a thermal oxide layer. The conductive layer 14 may be, for example, a poly-silicon layer. The lower etch stop layer 16 may include a material (e.g., a silicon nitride layer) having a difference in etch selectivity from the conductive and buffer layers 14 and 18. The buffer layer 18 may include a material (e.g., a poly-silicon layer) having a difference in etch selectivity from the lower etch stop layer 16 and the upper etch stop layer 20. The upper etch stop layer 20 may include a material (e.g., a silicon nitride layer) having a difference in etch selectivity from the buffer layer 18.

First sacrificial patterns 22 and second sacrificial patterns 24 may be formed on the upper etch stop layer 20. The first sacrificial patterns 22 may be formed on the first region 10a of the substrate 10, and the second sacrificial patterns 24 may be formed on the second region 10b of the substrate 10. The first and second sacrificial patterns 22 and 24 may include a material (e.g., a poly-silicon layer) having a difference in etch selectivity from the upper etch stop layer 20.

A first spacer layer 26 may be formed on the upper etch stop layer 20 to conformally cover the first and second sacrificial patterns 22 and 24. The first spacer layer 26 may be formed on both of the first and second regions 10a and 10b of the substrate 10. The first spacer layer 26 may include a material having a difference in etch selectivity from the first and second sacrificial patterns 22 and 24 and the upper etch stop layer 20, and in example embodiments, the first spacer layer 26 may be a silicon oxide layer. The first spacer layer 26 may be formed using an atomic layer deposition (ALD) process. In one embodiment, a width W1 of each of the first sacrificial patterns 22 may be substantially equal to a distance (hereinafter, a width W2) between opposite sidewalls of the first spacer layer 26 covering an adjacent pair of the first sacrificial patterns 22. In addition, a width W3 of each of the second sacrificial patterns 24 may be substantially equal to a distance (hereinafter, a width W4) between opposite sidewalls of the first spacer layer 26 covering an adjacent pair of the second sacrificial patterns 24. Further, according to example embodiments, the widths W1, W2, W3, and W4 may be the same as each other.

Figure 1B:
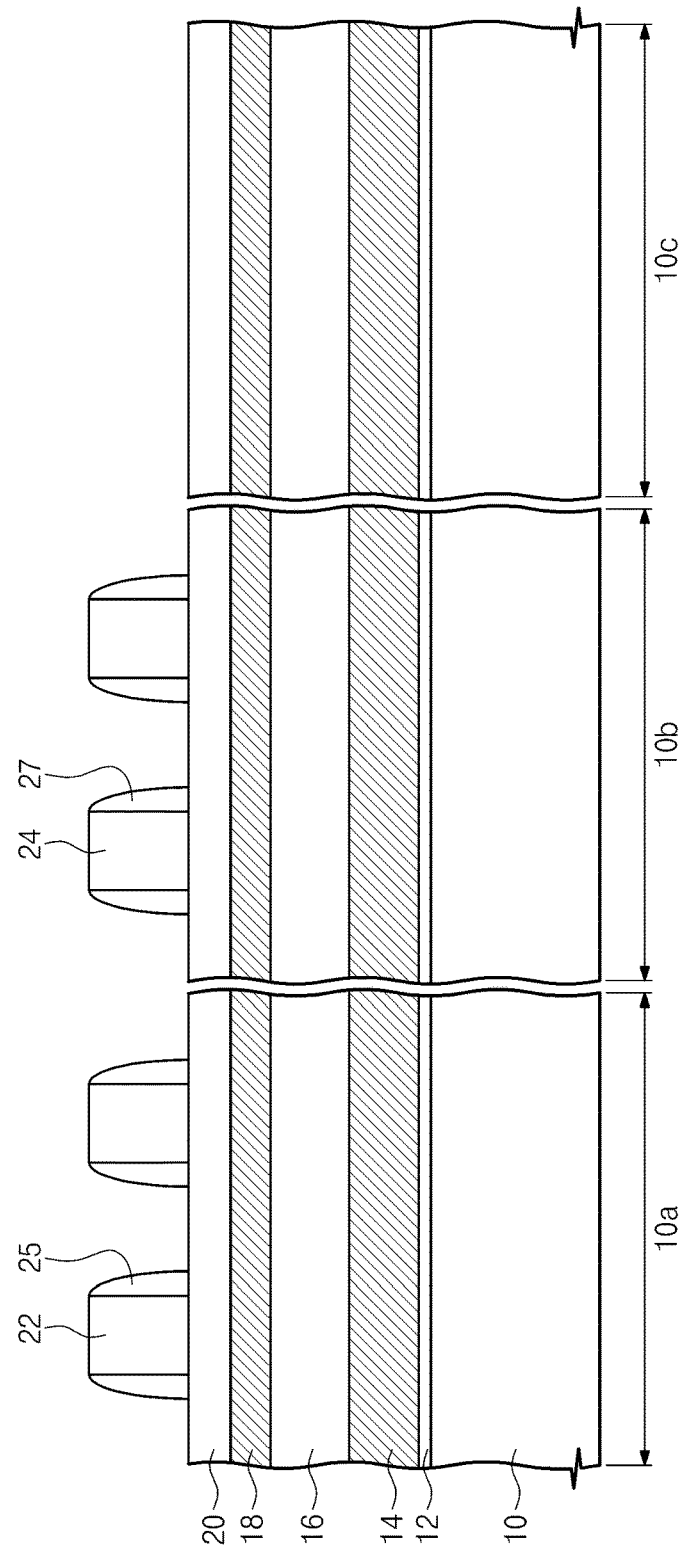

Referring to FIG. 1B, first and second spacers 25 and 27 may be formed on sidewalls of the first and second sacrificial patterns 22 and 24. For example, an etch-back process may be performed on the first spacer layer 26 to expose top surfaces of the upper etch stop layer 20 and the first and second sacrificial patterns 22 and 24. Accordingly, the first spacers 25 may be formed on both (e.g., opposite) sides of each of the first sacrificial patterns 22, and the second spacers 27 may be formed on both (e.g., opposite) sides of each of the second sacrificial patterns 24. A set of first sacrificial patterns 22 may include a plurality of first sacrificial patterns 22. A set of second sacrificial patterns 24 may include a plurality of second sacrificial patterns 24. A set of the first spacers 25 may include a plurality of pairs of first spacers. Similarly, a set of the second spacers 27 may include a plurality of pairs of second spacers.

Figure 1C:
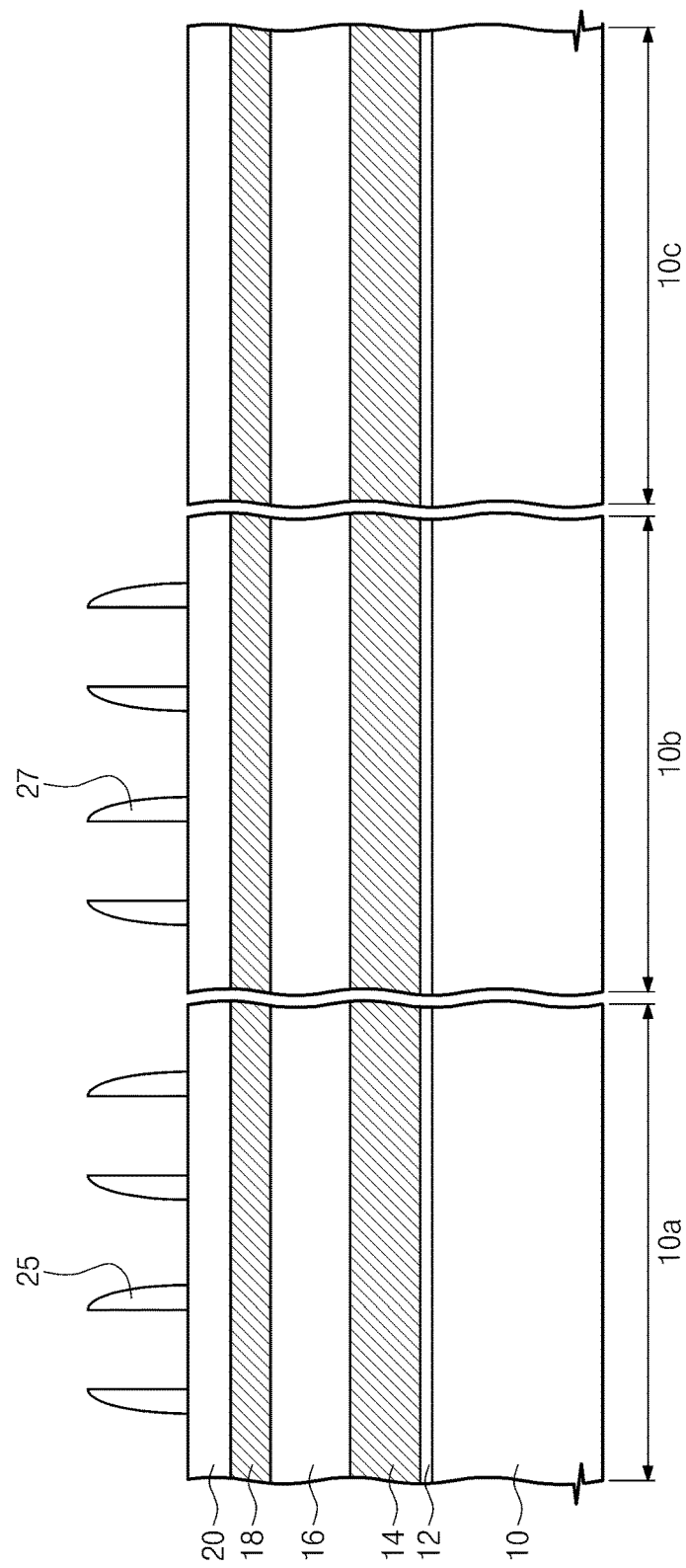

Referring to FIG. 1C, the first and second sacrificial patterns 22 and 24 may be selectively removed. The first and second spacers 25 and 27 may remain on the upper etch stop layer 20.

Figure 1D:
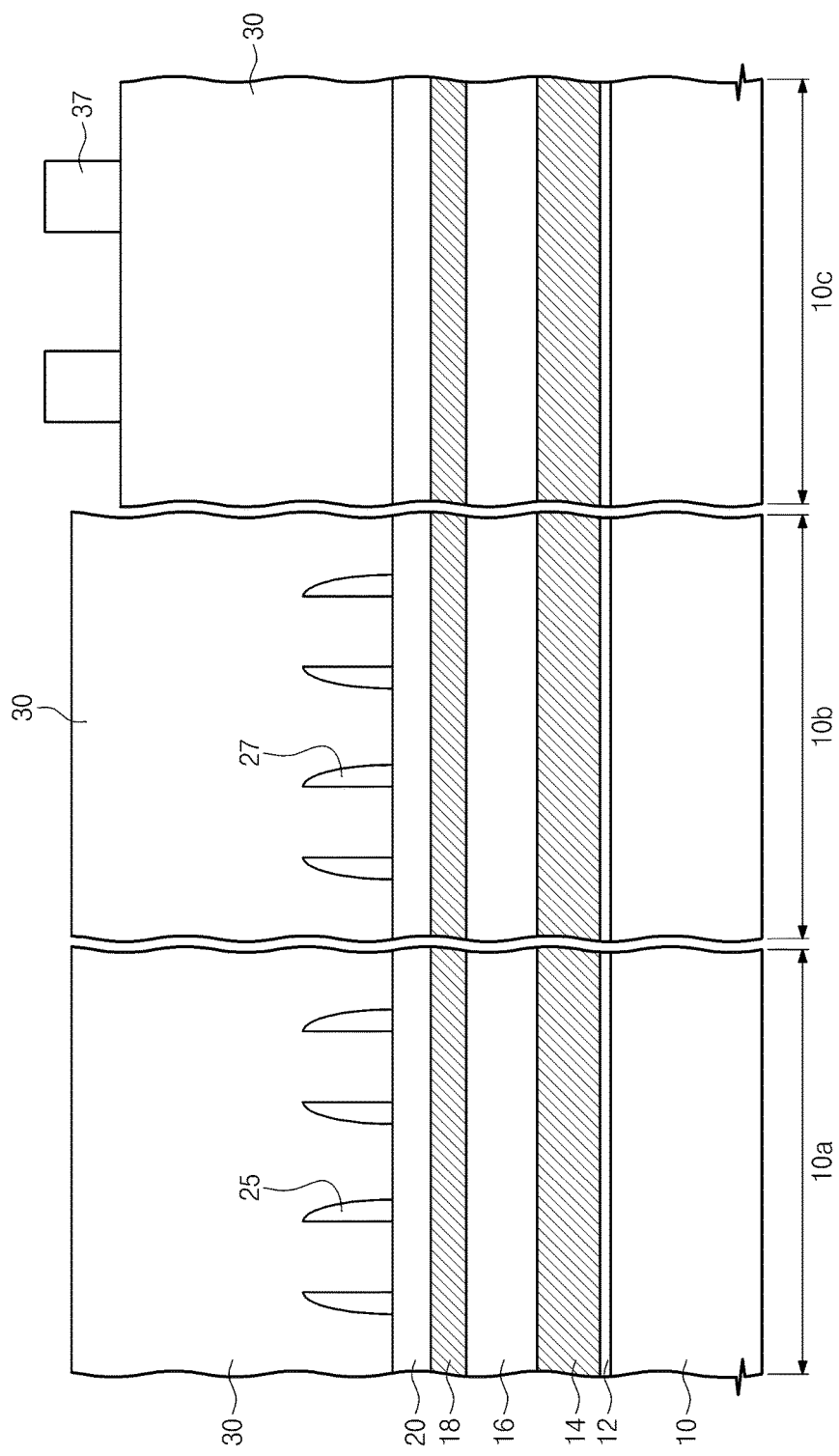

Referring to FIG. 1D, a first mask layer 30 may be formed to cover the upper etch stop layer 20 provided with the first and second spacers 25 and 27. The first mask layer 30 may be formed to cover the first, second, and third regions 10a, 10b, and 10c of the substrate 10. A hardmask pattern 37 may be formed on the third region 10c covered with the first mask layer 30. In a subsequent process, the hardmask pattern 37 may be used to define geometrical features (e.g., width and shape) of a pattern, which will be formed on the third region 10c of the substrate 10. The first mask layer 30 may be formed thicker on the first and second regions 10a and 10b than on the third region 10c. The difference in thickness of the first mask layer 30 may result from the presence of the first and second spacers 25 and 27, which are locally formed on the first and second regions 10a and 10b but not on the third region 10c. The first mask layer 30 may be, for example, spin-on-hardmask (SOH) patterns.

Figure 1E:
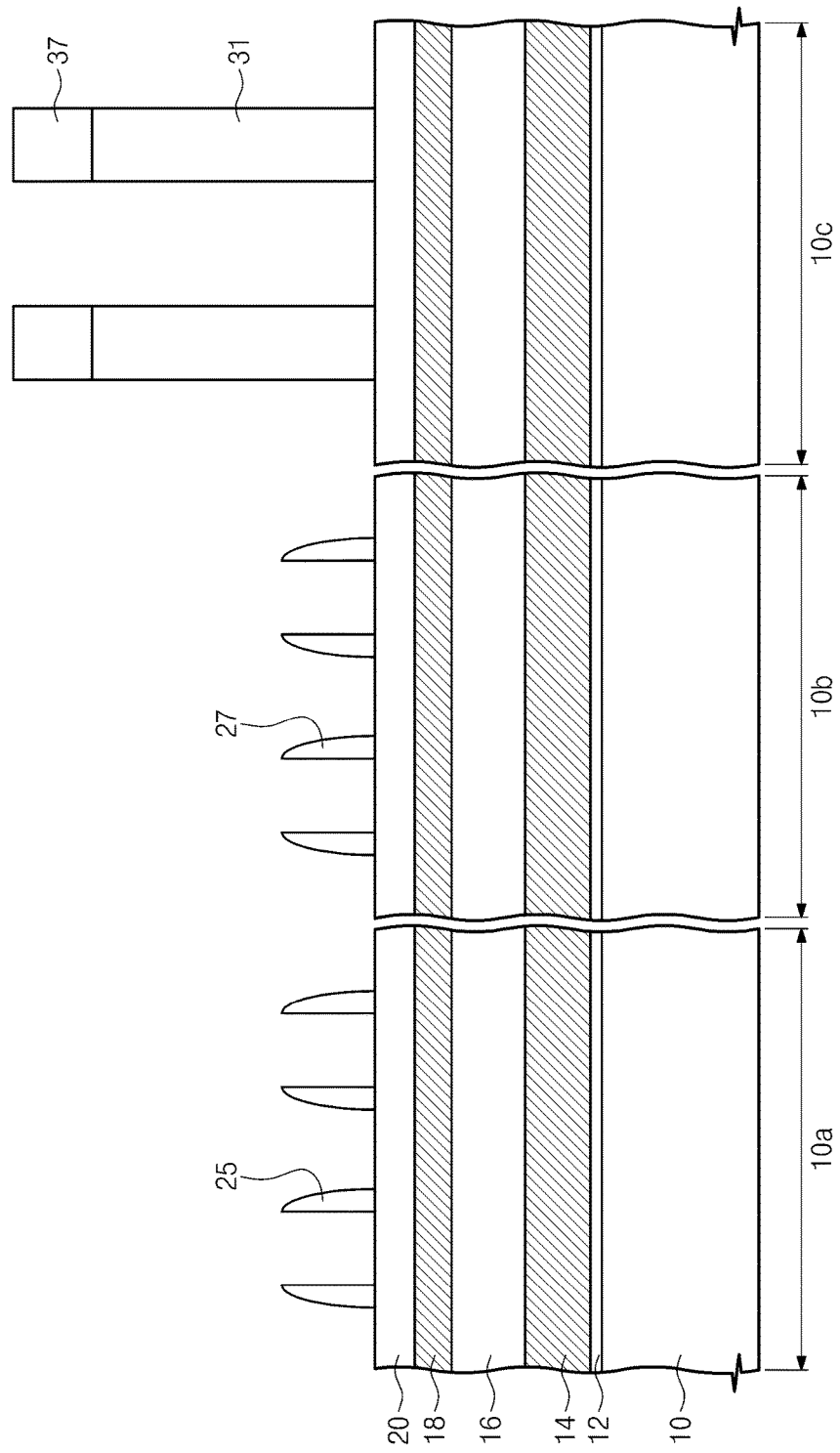

Referring to FIG. 1E, portions of the first mask layer 30 exposed by the hardmask pattern 37 may be etched to form first mask patterns 31. For example, the first mask patterns 31 may be formed on the third region 10c of the substrate 10. The first mask layer 30 may be removed from the first and second regions 10a and 10b of the substrate 10 to expose the first and second spacers 25 and 27.

Figure 1F:
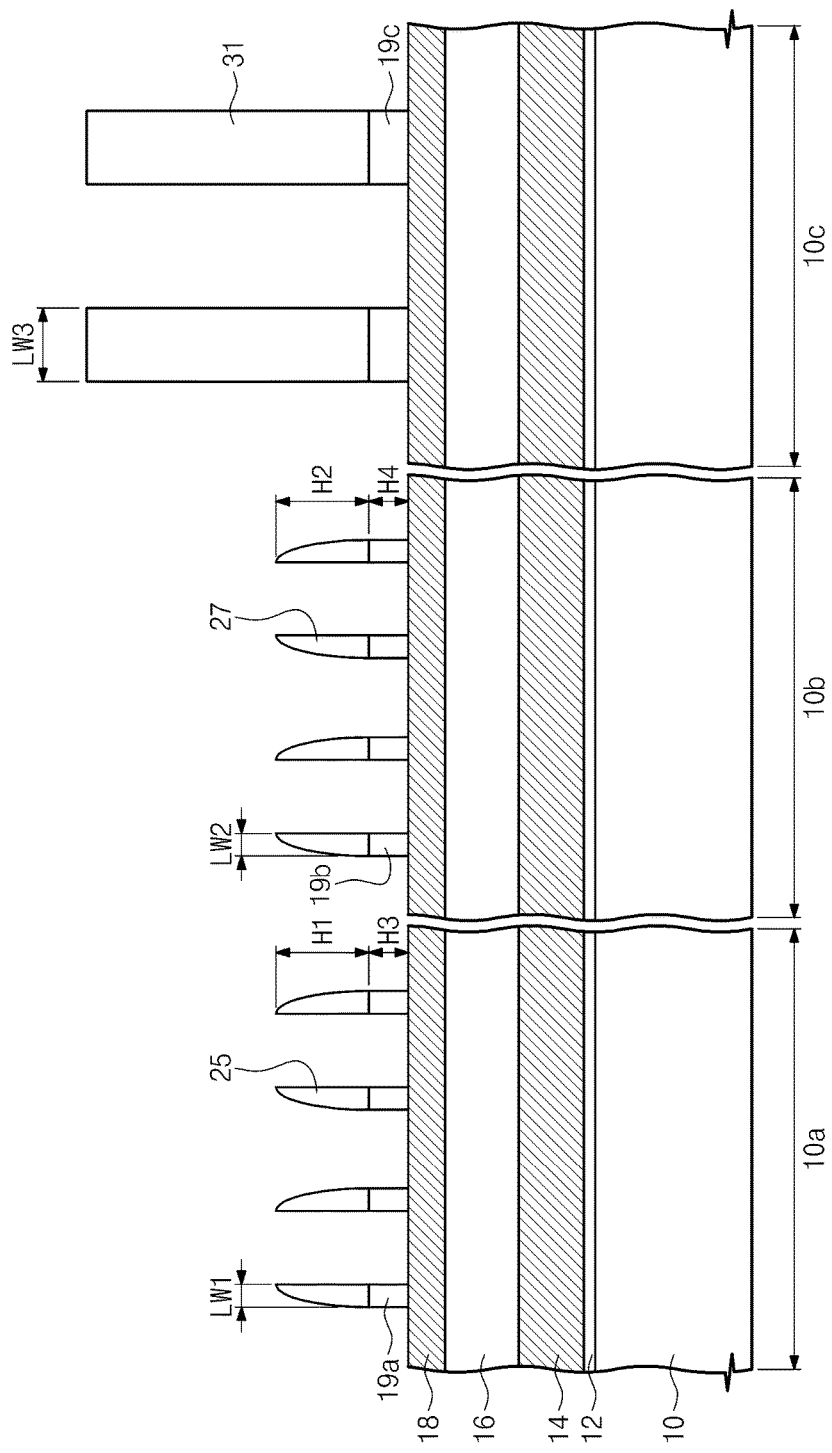

Referring to FIG. 1F, the hardmask pattern 37 may be removed after the formation of the first mask pattern 31. The upper etch stop layer 20 may be patterned to form first, second, third upper patterns 19a, 19b, and 19c on the substrate 10. For example, the first upper patterns 19a may include a set of patterns formed on the first region 10a of the substrate 10, the second upper patterns 19b may include a set of patterns formed on the second region 10b of the substrate 10, and the third upper patterns 19c may include a set of patterns formed on the third region 10c of the substrate 10. The first upper patterns 19a may be formed by etching portions of the upper etch stop layer 20 exposed by the first spacers 25. The second upper patterns 19b may be formed by etching portions of the upper etch stop layer 20 exposed by the second spacers 27. The third upper patterns 19c may be formed by etching portions of the upper etch stop layer 20 exposed by the first mask patterns 31. The first spacers 25, the second spacers 27, and the first mask patterns 31 may be formed of a material having an etch selectivity with respect to the upper etch stop layer 20, and thus, they can be used to as an etch mask in the process of etching the upper etch stop layer 20. In certain embodiments, an etching solution containing phosphoric acid ($H_3PO_4$) may be used to selectively etch the upper etch stop layer 20 in the etching process.

The first upper pattern 19a may be formed to each have a first width LW1, the second upper pattern 19b may be formed to each have a second width LW2, and the third upper pattern 19c may be formed to each have a third width LW3. In certain embodiments, the first and second widths LW1 and LW2 may be equal to each other, and the third width LW3 may be larger than the first and second widths LW1 and LW2.

In certain embodiments, a height H1 of the first spacer 25 may be substantially equal to a height H2 of the second spacer 27, and a height H3 of the first upper pattern 19a may be substantially equal to a height H4 of the second upper pattern 19b. The heights H3 and H4 of the first and second upper patterns 19a and 19b may be smaller than the heights H1 and H2 of the first and second spacers 25 and 27.

Figure 1G:
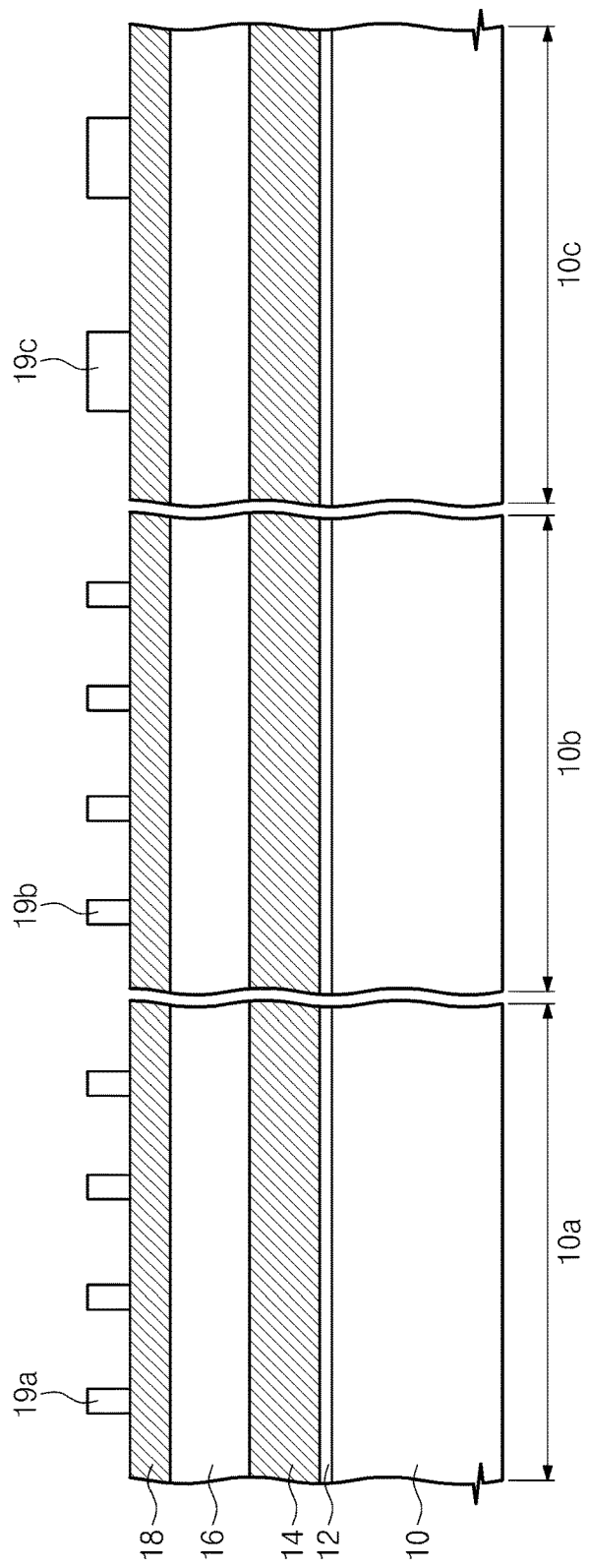

Referring to FIG. 1G, the first mask patterns 31 may be removed. For example, the first mask patterns 31 may be removed using an ashing process. As a result of the removal of the first mask patterns 31, top surfaces of the third upper patterns 19c may be exposed on the third region 10c of the substrate 10. Thereafter, the first and second spacers 25 and 27 may be removed from the first and second regions 10a and 10b. For example, the first and second spacers 25 and 27 may be removed by a wet etching process using a fluorine-based etchant (e.g., HF). These two steps need not be performed in this order, however.

Figure 1H:
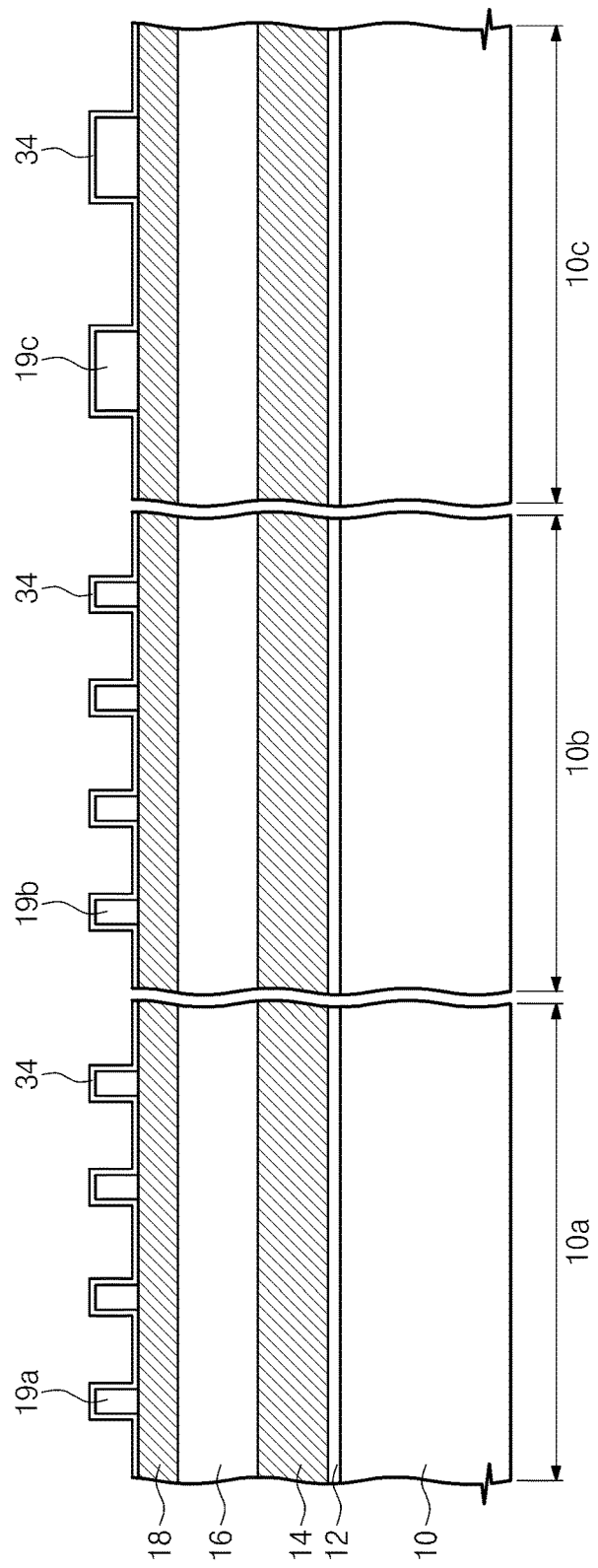

Referring to FIG. 1H, a second spacer layer 34 may be formed on the substrate 10 with the first, second, and third upper patterns 19a, 19b, and 19c. For example, the second spacer layer 34 may be formed on the buffer layer 18 to conformally cover the first, second, and third upper patterns 19a, 19b, and 19c. The second spacer layer 34 may include a material having an etch selectivity with respect to the first to third upper patterns 19a, 19b, and 19c and the buffer layer 18. For example, the second spacer layer 34 may be a silicon oxide layer.

Referring to FIG. 1I, a second mask layer 36 may be formed on the second region 10b of the substrate 10. The second mask layer 36 may include a material having an etch selectivity with respect to the second spacer layer 34. For example, the second mask layer 36 may be a SOH layer.

Figure 1J:
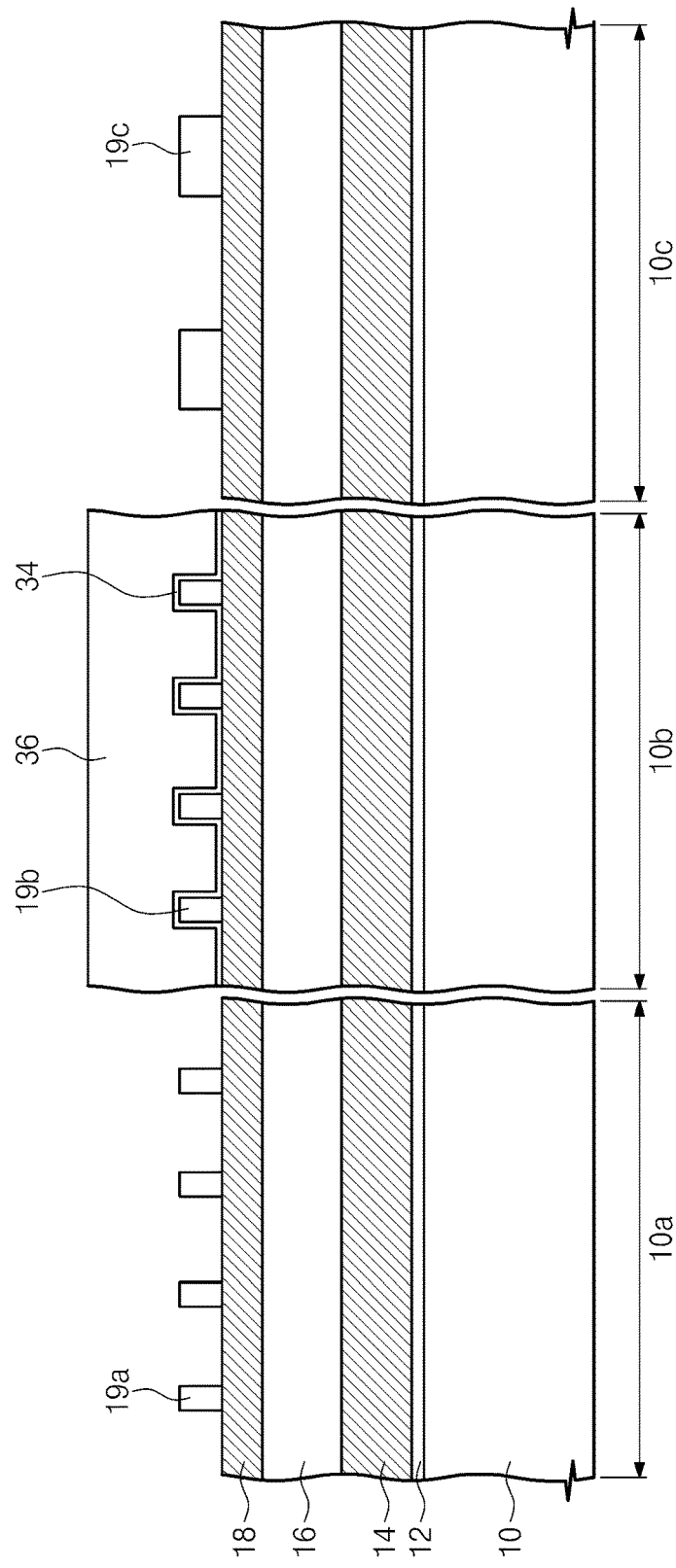

Referring to FIG. 1J, the second spacer layer 34 exposed by the second mask layer 36 may be removed to expose the first upper pattern 19a and the third upper pattern 19c. The removal of the second spacer layer 34 may be performed using, for example, a wet etching process. For example, the second spacer layer 34 may be removed by a wet etching process using a fluorine-based etchant (e.g., HF). The second spacer layer 34 on the second region 10b of the substrate 10 may not be removed in this removal process, because it is covered by the second mask layer 36.

Figure 1K:
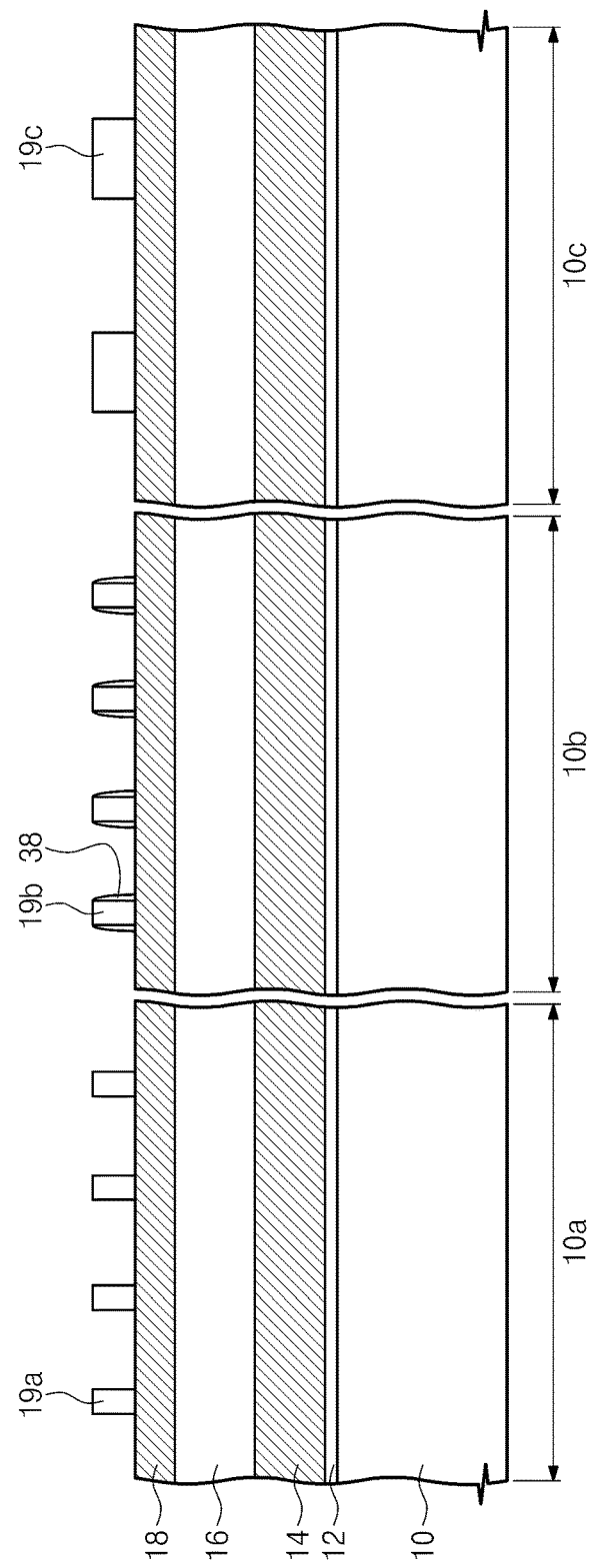

Referring to FIG. 1K, the second mask layer 36 is removed from the second region 10b of the substrate 10, and then, an etch-back process may be performed on the second spacer layer 34 to form fourth spacers 38 on both (e.g., opposite) sidewalls of the second upper pattern 19b.

Figure 1L:
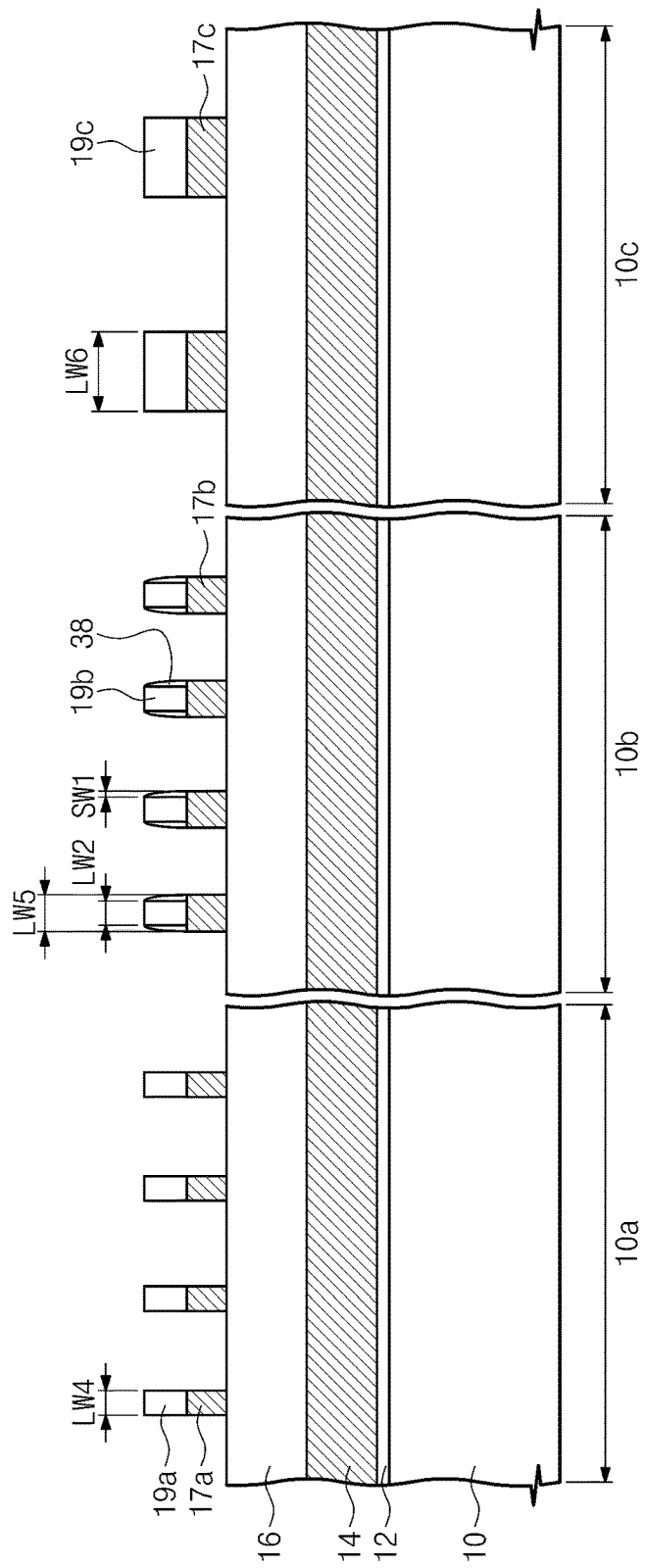

Referring to FIG. 1L, the buffer layer 18 may be patterned to form first buffer patterns 17a, second buffer patterns 17b, and third buffer patterns 17c. For example, the buffer layer 18 exposed by the first upper patterns 19a may be etched to form the first buffer patterns 17a on the first region 10a of the substrate 10. The buffer layer 18 exposed by the second upper patterns 19b and the fourth spacers 38 may be etched to form the second buffer patterns 17b on the second region 10b of the substrate 10. The buffer layer 18 exposed by the third upper patterns 19c may be etched to form the third buffer patterns 17c on the third region 10c of the substrate 10.

A width LW4 of a first buffer pattern 17a may be smaller than a width LW5 of a second buffer pattern 17b, and the width LW5 of a second buffer pattern 17b may be smaller than a width LW6 of a third buffer pattern 17c. In one embodiment, the width LW5 of the second buffer pattern 17b may be substantially equal to a sum of widths of the second upper pattern 19b and the fourth spacers 38 disposed on both sidewalls thereof (i.e., LW5=LW2+2×SW1).

In the case of the conventional double patterning process, the first and second spacers 25 and 27 (for example, see FIG. 1C) may be used as an etch mask for patterning an underlying layer exposed by the first and second spacers 25 and 27, and thus, the final patterns may be formed to have the same widths as the first and second spacers 25 and 27. As described with reference to FIG. 1B, the first and second spacers 25 and 27 may be formed by performing an etch-back process on the first spacer layer 26, and thus, sidewalls of the first and second spacers 25 and 27 may be formed to have convexly-curved sidewalls, as shown in FIG. 1B. Further, in the case where the first and second spacers 25 and 27 have a high thickness, the convexly-curved sidewall thereof may have a steep slope. The convexly-curved sidewall of the first and second spacers 25 and 27 may lead to a technical difficulty in a process of patterning the underlying layer. For example, the final patterns may also be formed to have a convexly-curved sidewall, which is different from a desired pattern profile.

According to example embodiments of the inventive concept, the upper etch stop layer 20 may be etched using the first and second spacers 25 and 27 as an etch mask to form the first and second upper patterns 19a and 19b. Here, the upper etch stop layer 20 may be thinner than the first and second spacers 25 and 27 (e.g., thinner in terms of a vertical thickness). Also, when viewed in a sectional view, each of the first and second upper patterns 19a and 19b can be formed in such a way that a top corner, where top and side surfaces thereof meet each other, has a sharp profile; for example, the first and second upper patterns 19a and 19b can be formed without the inclusion on sidewall profiles of the first and second spacers 25 and 27. Accordingly, by removing the first and second spacers 25 and 27 and using the first and second upper patterns 19a and 19b as an etch mask, the final patterns can be formed to have the same widths as the first and second spacers 25 and 27 and have no curved surface. For example, each of the first and second upper patterns 19a and 19b may have two opposite corners where a top surface meets a side surface, and each opposite corner can have an angled, sharp corner profile (e.g., in one embodiment a substantially 90° profile).

Further, a spacer layer may be formed on a region, on which thicker patterns will be formed, and in this case, a double patterning technology can be used to form various patterns with different widths. For example, according to example embodiments of the inventive concept, the second spacer layer 34 may be formed on the second region 10b of the substrate 10 to conformally cover a surface of the second upper pattern 19b, and next, an etch-back process may be performed on the second spacer layer 34 to form the fourth spacers 38 (for example, see FIG. 1K). Accordingly, on the second region 10b of the substrate 10, it is possible to use the second upper pattern 19b, in conjunction with the fourth spacers 38 provided on sidewalls thereof, as the etch mask, and thus, widths of underlying patterns may be greater on the second region 10b than on the first region 10a. Since the fourth spacers 38 can be formed to have a small thickness, a subsequent patterning process may not be significantly affected by a profile of the fourth spacer 38.

Figure 1M:
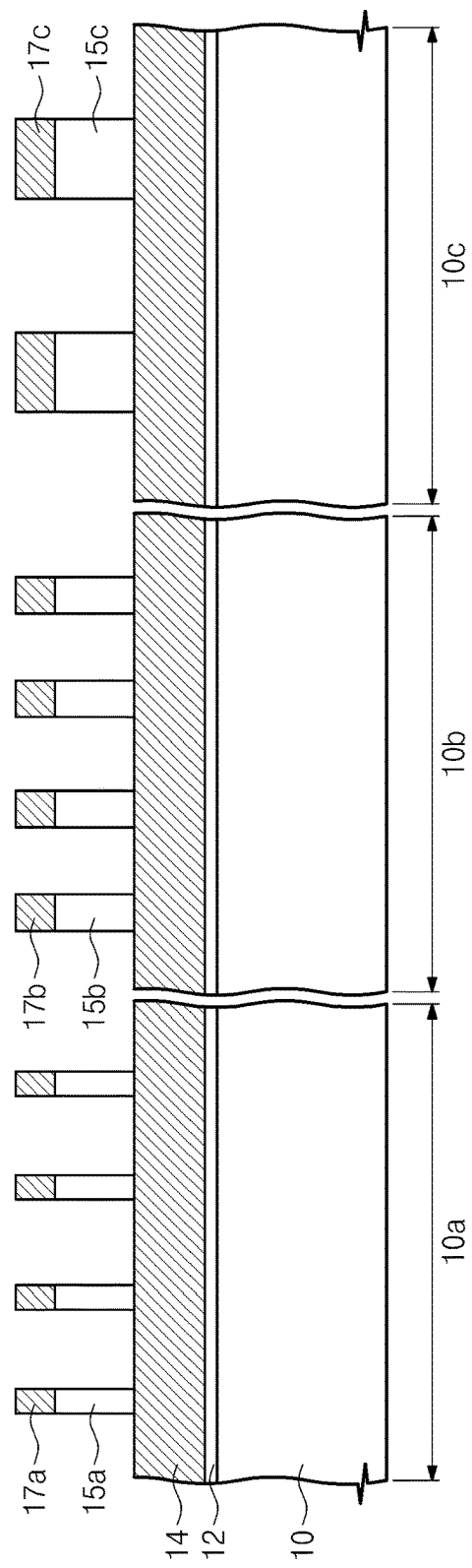

Referring to FIG. 1M, the lower etch stop layer 16 may be patterned to form a set of first lower patterns 15a, a set of second lower patterns 15b, and a set of third lower patterns 15c. For example, the lower etch stop layer 16 exposed by the first buffer patterns 17a may be etched to form the first lower patterns 15a on the first region 10a of the substrate 10. The lower etch stop layer 16 exposed by the second buffer patterns 17b may be etched to form the second lower patterns 15b on the second region 10b of the substrate 10. The lower etch stop layer 16 exposed by the third buffer patterns 17c may be etched to form the third lower patterns 15c on the third region 10c of the substrate 10. The first to third upper patterns 19a, 19b, and 19c may be removed, when the lower etch stop layer 16 is etched. The fourth spacers 38 may also be removed. For example, top surfaces of the first to third buffer patterns 17a, 17b, and 17c may be exposed after the etching of the lower etch stop layer 16.

Figure 1N:
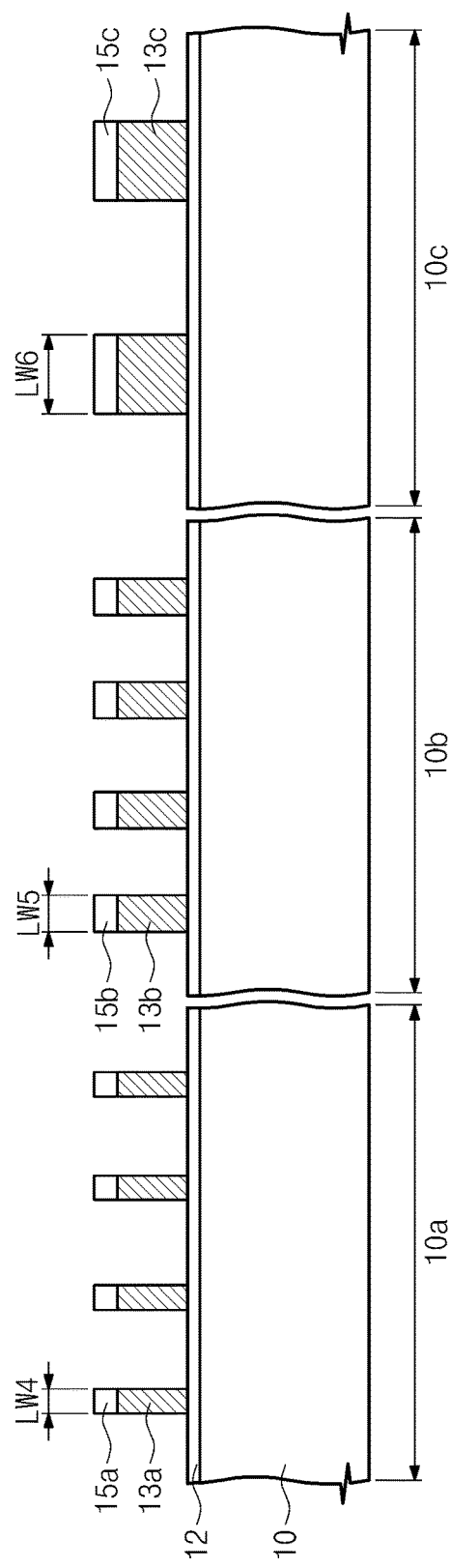

Referring to FIG. 1N, the conductive layer 14 may be patterned to form first conductive patterns 13a, second conductive patterns 13b, and third conductive patterns 13c. For example, the conductive layer 14 exposed by the first lower patterns 15a may be etched to form the first conductive patterns 13a on the first region 10a of the substrate 10. The conductive layer 14 exposed by the second lower patterns 15b may be etched to form the second conductive patterns 13b on the second region 10b of the substrate 10. The conductive layer 14 exposed by the third lower patterns 15c may be etched to form the third conductive patterns 13c on the third region 10c of the substrate 10. The first to third conductive patterns 13a, 13b, and 13c may be formed to expose portions of the insulating layer 12. The insulating layer 12 may be formed of a material having an etch selectivity with respect to the conductive layer 14, and thus, the insulating layer 12 may not be etched when the conductive layer 14 is etched. In certain embodiments, the first to third buffer patterns 17a, 17b, and 17c may be removed, when the conductive layer 14 is etched. For example, top surfaces of the first to third lower patterns 15a, 15b, and 15c may be exposed after the etching of the conductive layer 14.

The first conductive pattern 13a may be formed to have substantially the same width as the width LW4 of the first buffer pattern 17a, the second conductive pattern 13b may be formed to have substantially the same width as the width LW5 of the second buffer pattern 17b, and the third conductive pattern 13c may be formed to have substantially the same width as the width LW6 of the third buffer pattern 17c.

Referring to FIG. 1O, the insulating layer 12 exposed by the first to third conductive patterns 13a, 13b, and 13c may be etched. As a result of the etching of the insulating layer 12, first insulating patterns 11a may be formed on the first region 10a of the substrate 10, second insulating patterns 11b may be formed on the second region 10b, and third insulating patterns 11c may be formed on the third region 10c.

In addition, recess regions 39 may be formed on the top surface of the substrate 10 exposed by the first to third insulating patterns 11a, 11b, and 11c, and source/drain regions S/D may be formed in the recess regions 39, respectively. The recess regions 39 may be formed by etching the exposed top surface of the substrate 10 using the first to third lower patterns 15a, 15b, and 15c as an etch mask. In one embodiment, the formation of the source/drain region S/D may include forming an epitaxial layer to fill the recess regions 39. As an example, for an NMOS FET, the formation of the source/drain region S/D may include epitaxially growing a silicon carbide (SiC) layer. As another example, for a PMOS FET, the formation of the source/drain region S/D may include epitaxially growing a silicon germanium (SiGe) layer.

After the formation of the source/drain region S/D, an interlayered insulating layer 40 may be formed on the substrate 10. The interlayered insulating layer 40 may be formed to cover the first to third conductive patterns 13a, 13b, and 13c. The interlayered insulating layer 40 may be formed, for example, of one of a silicon oxide layer, a silicon nitride layer, a silicon oxynitride layer, or low-k dielectric layers.

According to example embodiments of the inventive concept, the first to third insulating patterns 11a, 11b, and 11c may be used as gate insulating patterns of MOS transistors, and the first to third conductive patterns 13a, 13b, and 13c may be used as gate electrodes of the MOS transistors.

Figure 2A:
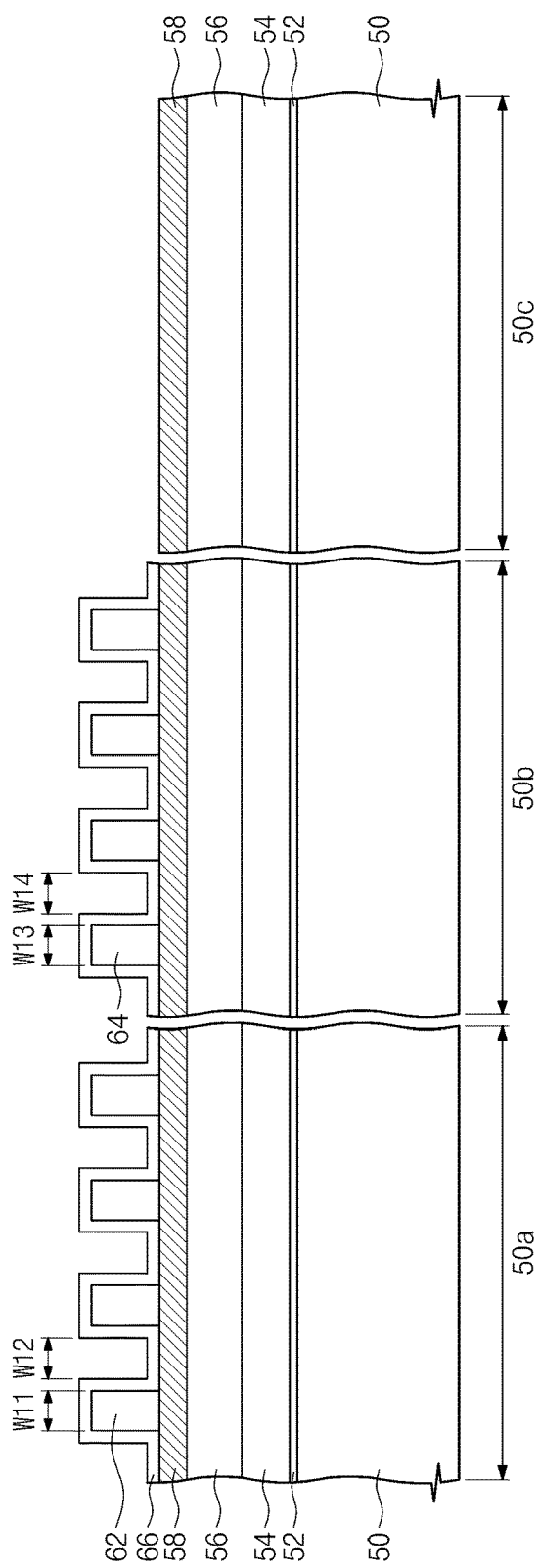
FIGS. 2A through 2O are sectional views illustrating a process of fabricating a semiconductor device using a fabrication method according to example embodiments of the inventive concept.
Figure 2B:
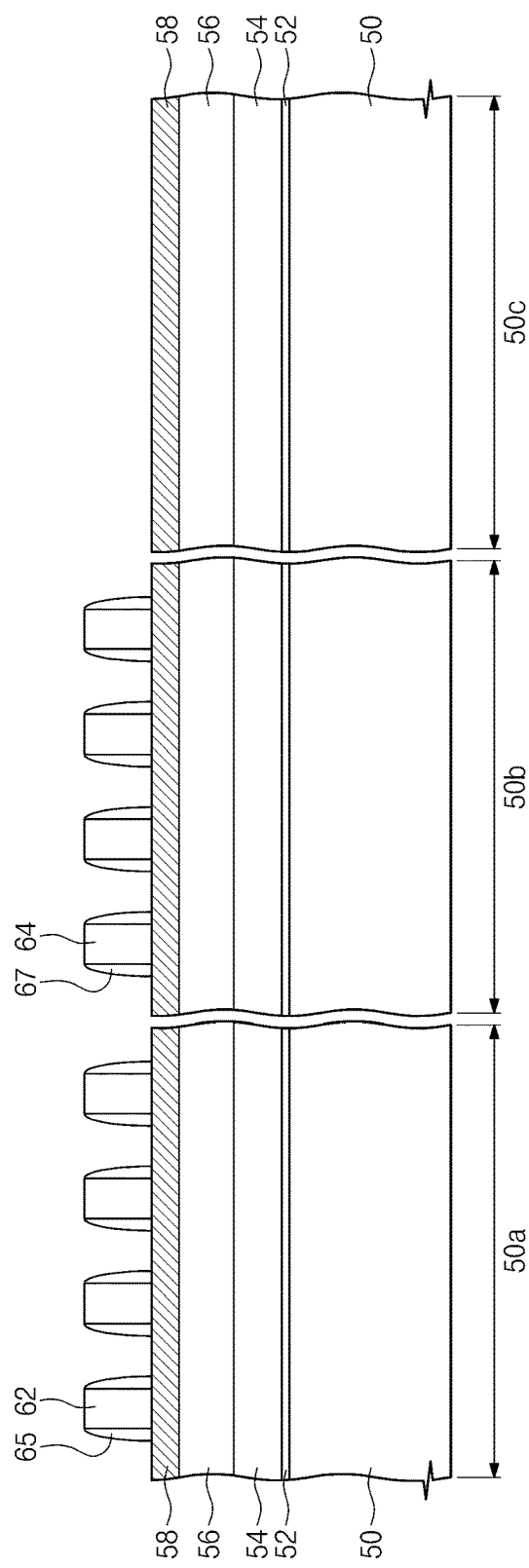
Figure 2C:
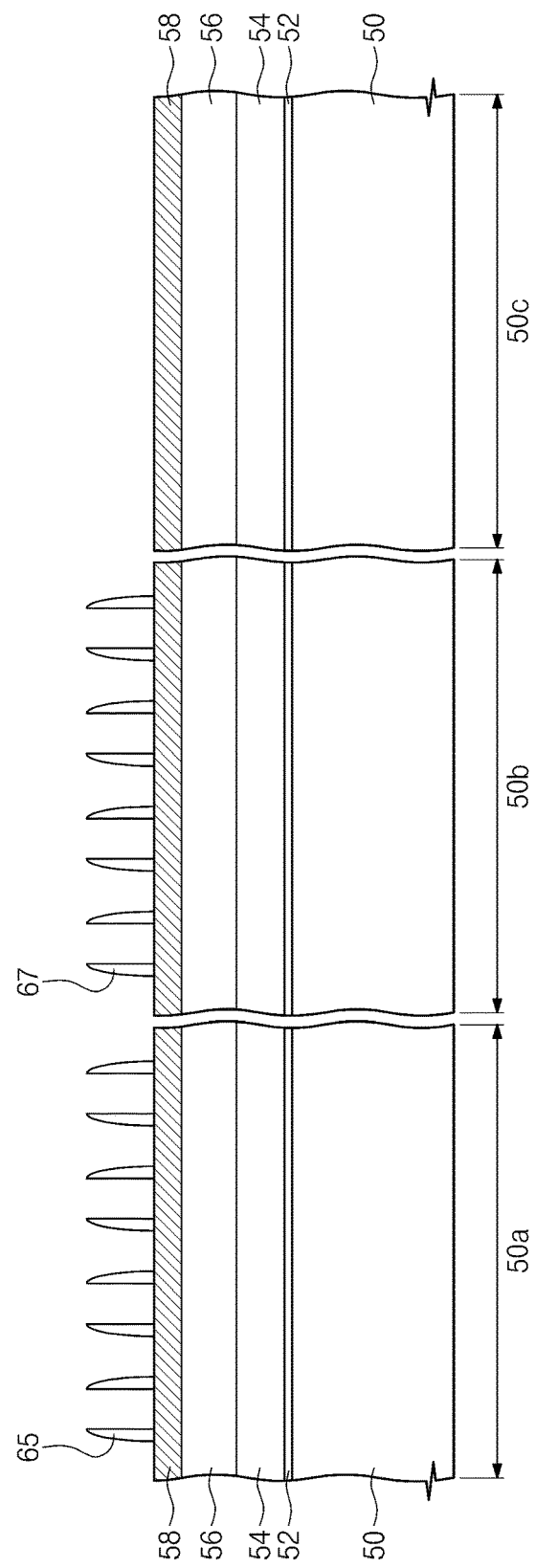
Figure 2D:
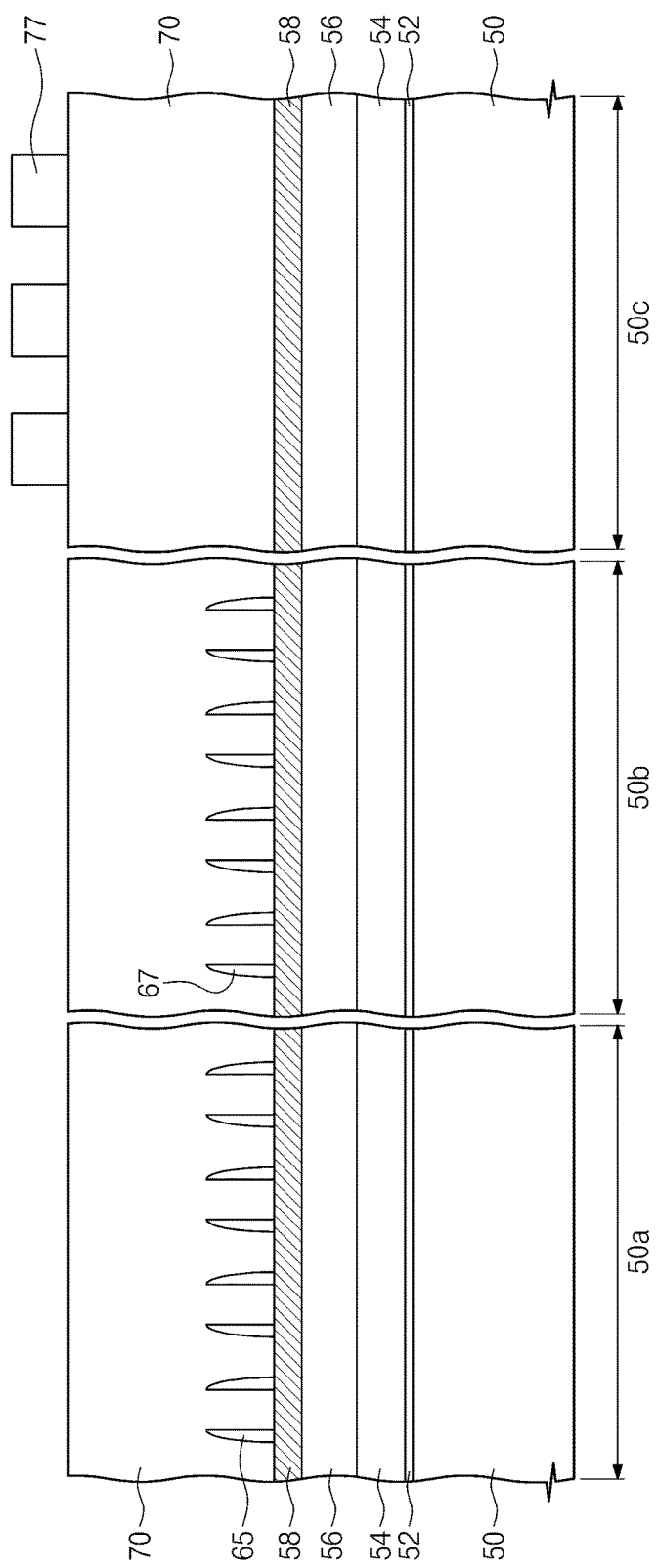
Figure 2E:
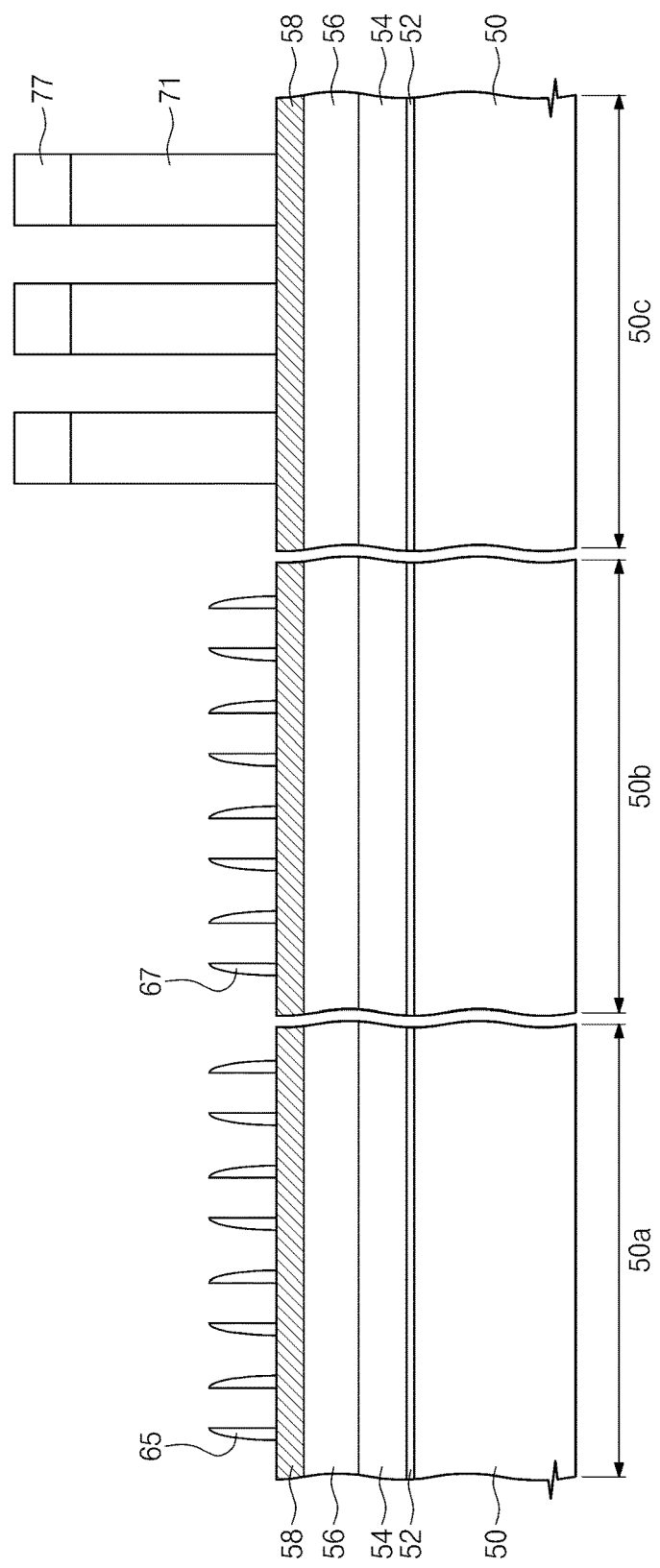
Figure 2F:
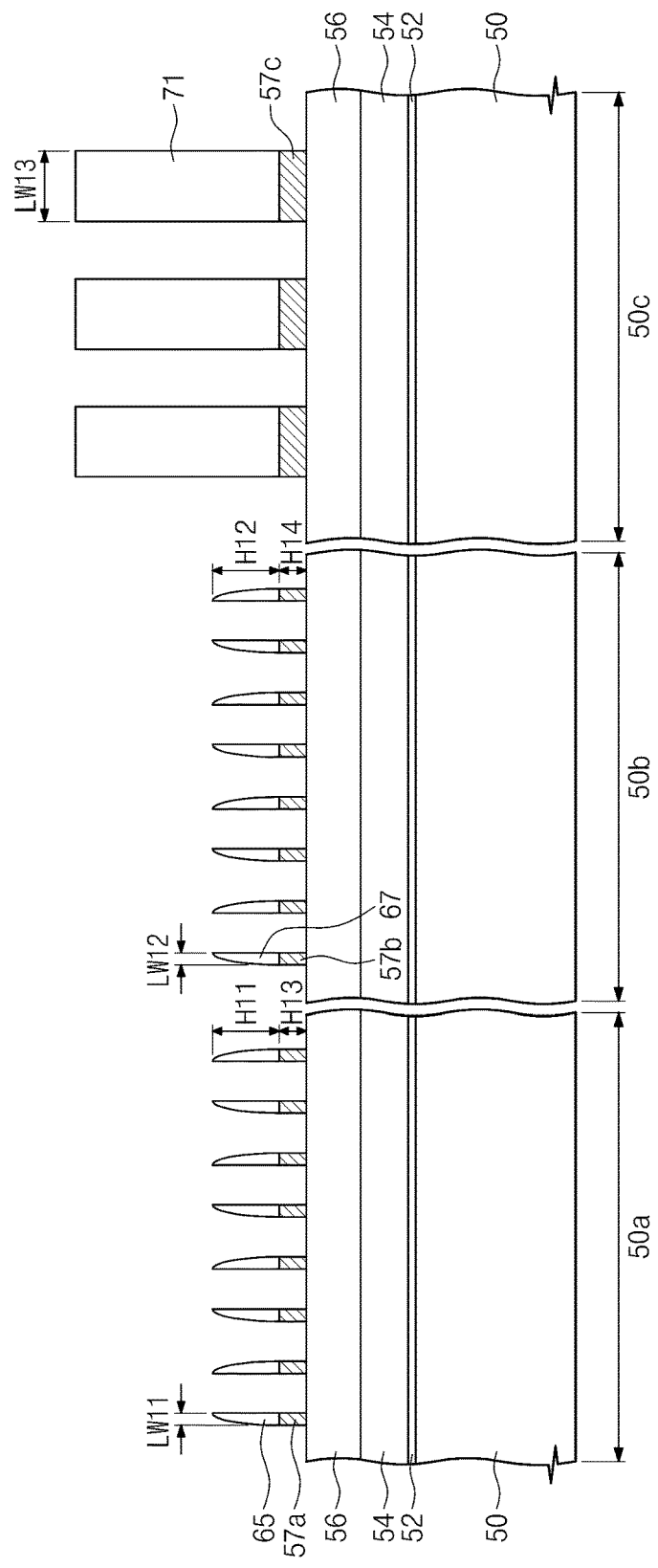
Figure 2G:
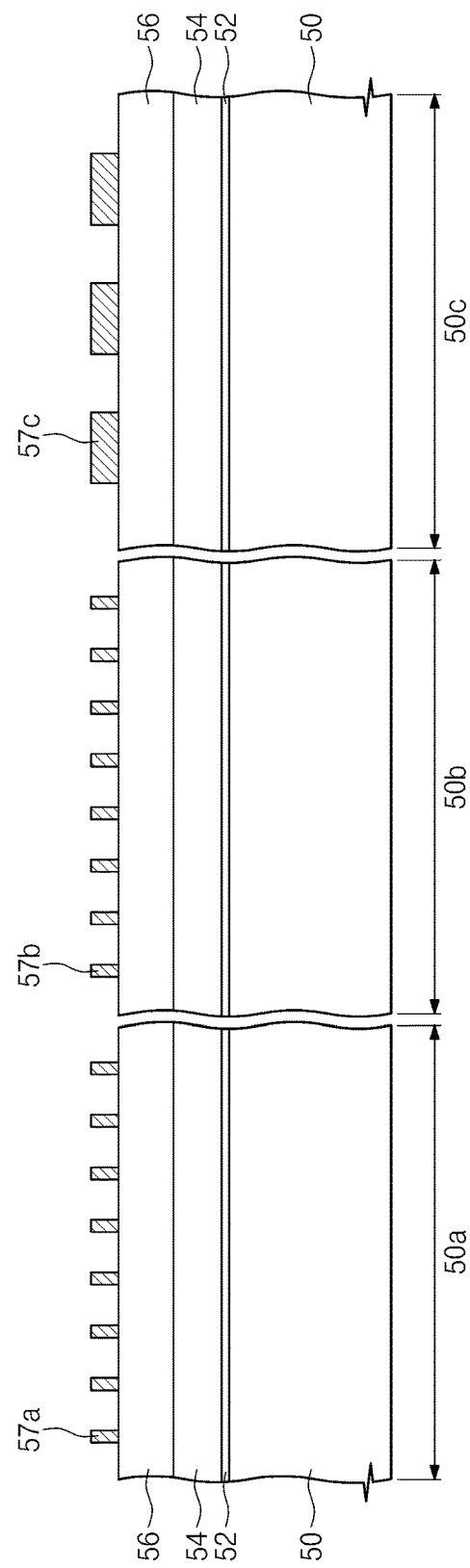
Figure 2H:
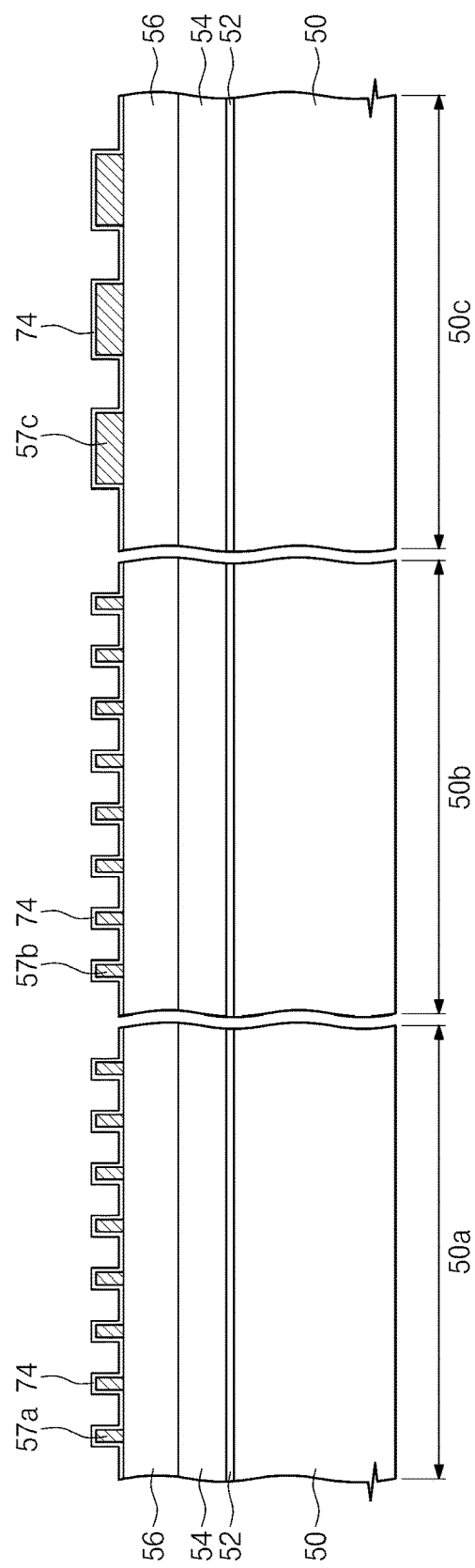
Figure 2I:
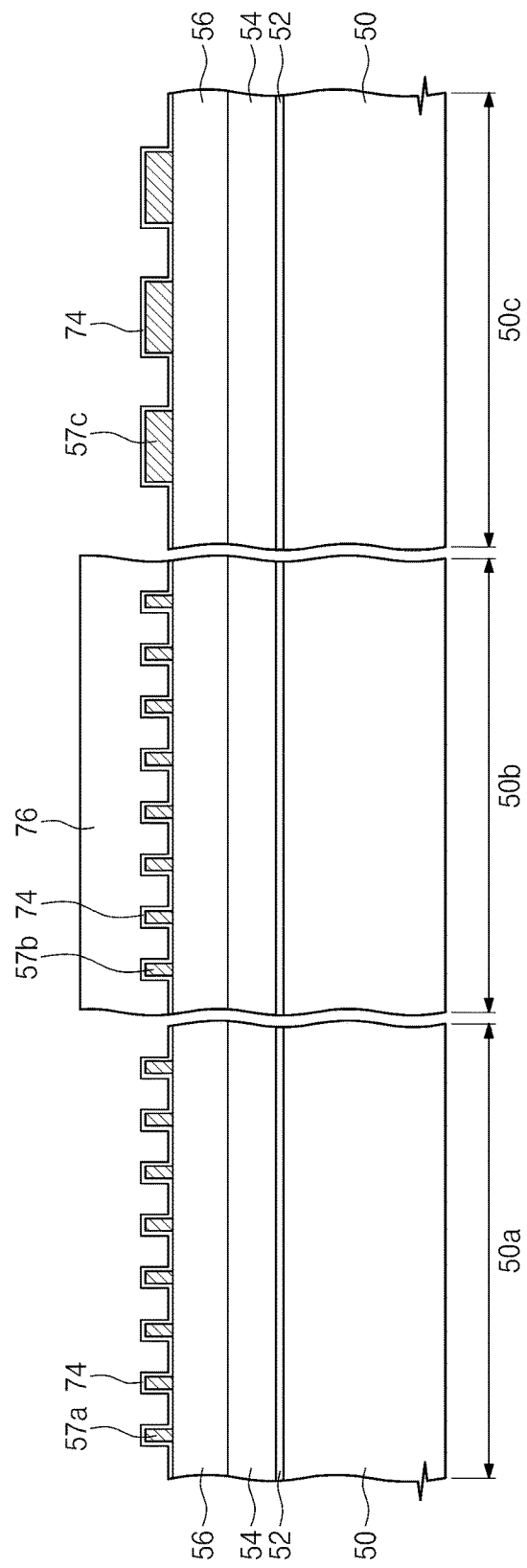
Figure 2J:
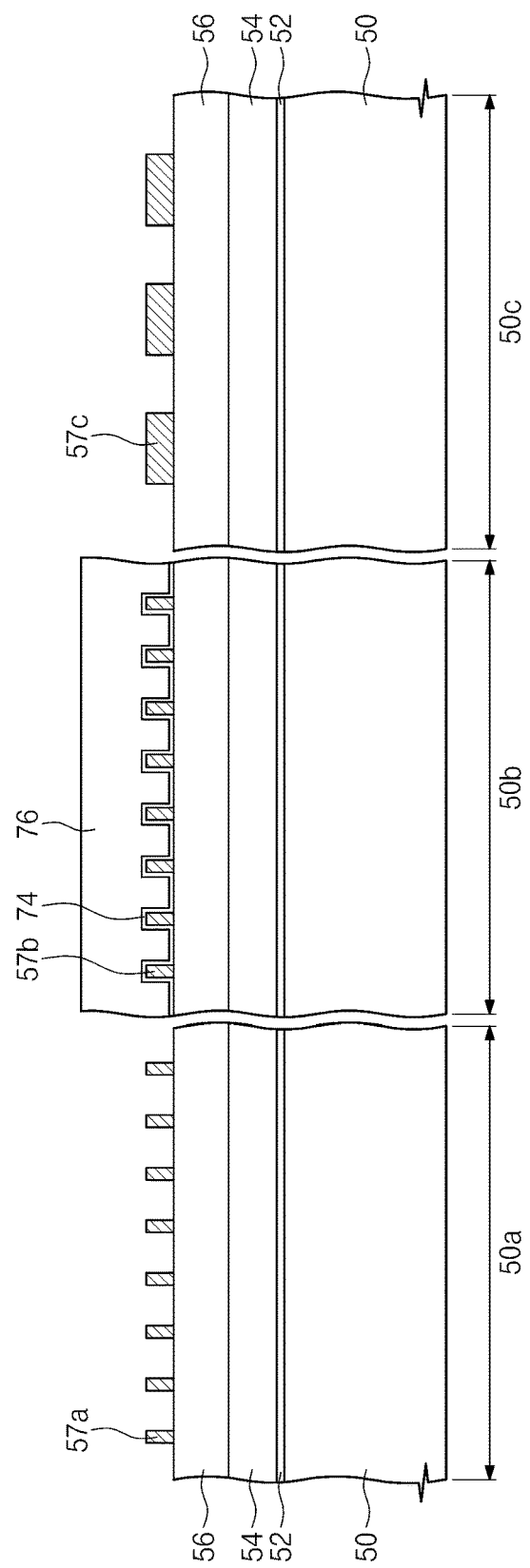
Figure 2K:
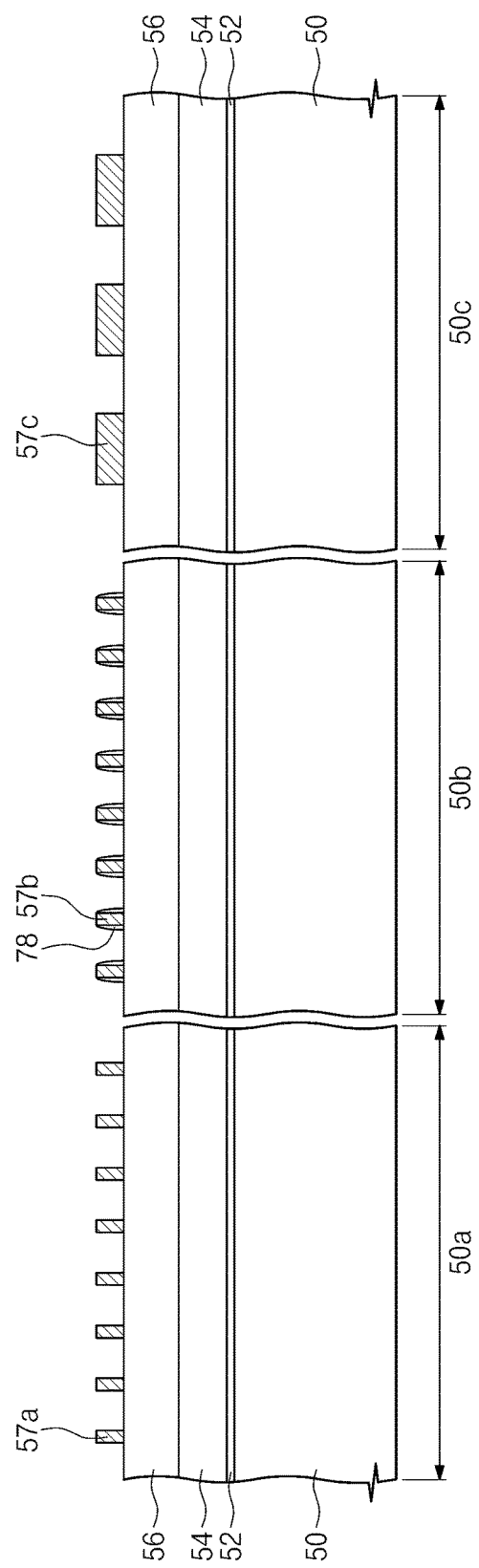
Figure 2L:
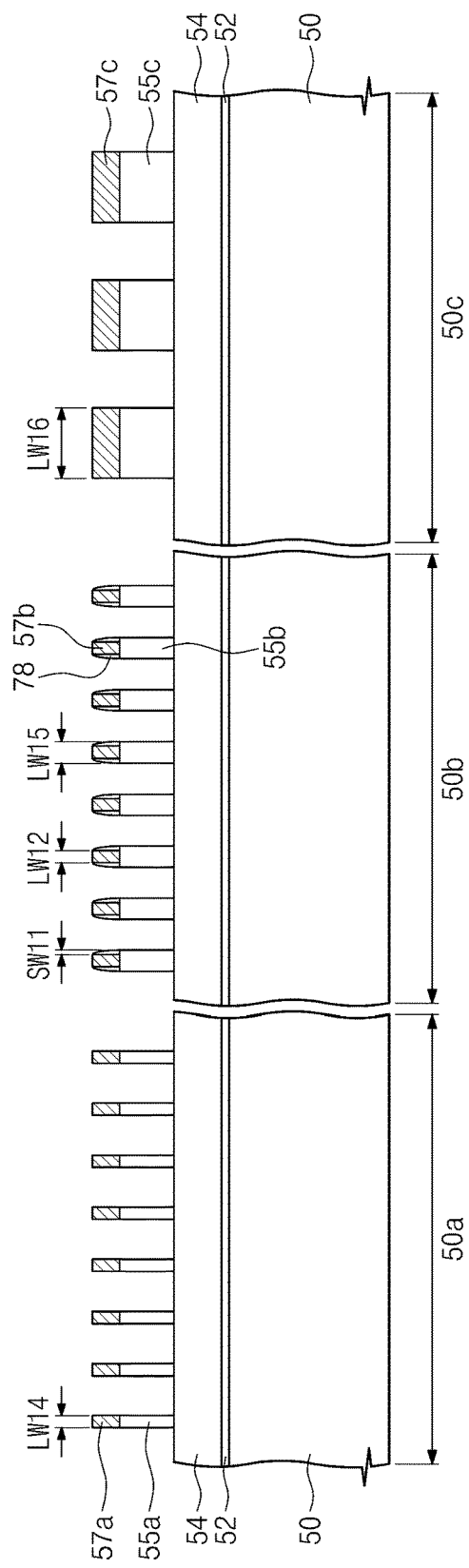
Figure 2M:
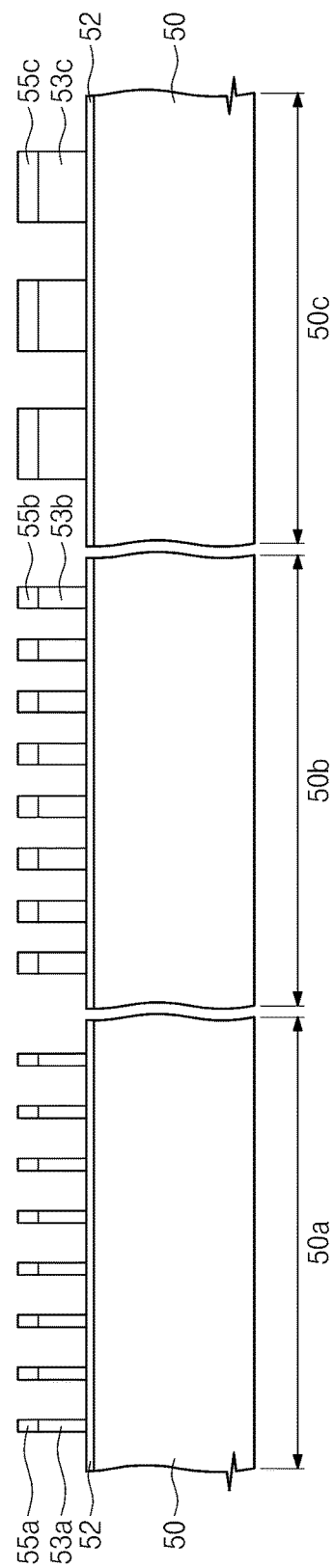
Figure 2N:
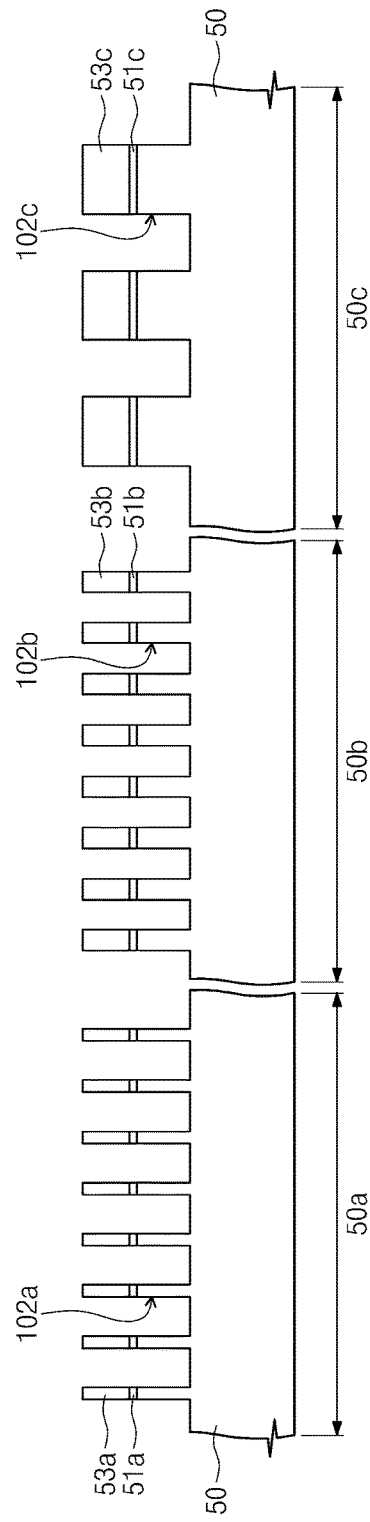
Figure 2O:
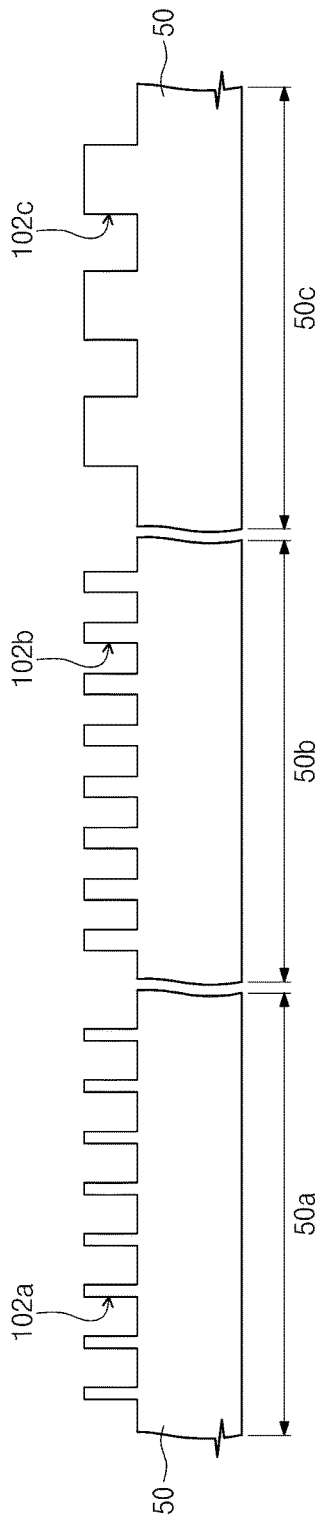

FIGS. 2A through 2O are sectional views illustrating a process of fabricating a semiconductor device using a fabrication method according to example embodiments of the inventive concept.

Referring to FIG. 2A, a substrate 50 may include a first region 50a, a second region 50b, and a third region 50c. The first region 50a may be, for example, a logic region, the second region 50b may be, for example, an SRAM region, and the third region 50c may be, for example, an I/O region.

An insulating layer 52, a hard mask layer 54, an etch stop layer 56, and a buffer layer 58 may be sequentially formed on the substrate 50. The insulating layer 52 may be, for example, an oxide layer or a thermal oxide layer. In certain cases, the insulating layer 52 may be omitted. The hard mask layer 54 may be, for example, a silicon nitride ($Si_3N_4$) layer. The etch stop layer 56 may include a material (e.g., oxide), which can be etched at a different etch rate from those of the hard mask layer 54 and the buffer layer 58. For example, the etch stop layer 56 may be a middle temperature oxide (MTO) layer. The buffer layer 58 may include a material (e.g., poly-silicon), which can be etched at a different etch rate from that of the etch stop layer 56.

First sacrificial patterns 62 and second sacrificial patterns 64 may be formed on the buffer layer 58. The first sacrificial patterns 62 may be formed on the first region 50a of the substrate 50, and the second sacrificial patterns 64 may be formed on the second region 50b of the substrate 50. The first and second sacrificial patterns 62 and 64 may include a material (e.g., a spin-on-hardmask (SOH) material), which can be etched at a different etch rate from that of the buffer layer 58.

A first spacer layer 66 may be formed on the buffer layer 58 to conformally cover the first and second sacrificial patterns 62 and 64. The first spacer layer 66 may be formed on the first and second regions 50a and 50b of the substrate 50. The first spacer layer 66 may include a material (e.g., silicon oxide), which can be etched at a different etch rate from those of the first and second sacrificial patterns 62 and 64 and the buffer layer 58. The first spacer layer 66 may be formed using an atomic layer deposition (ALD) process. A width W11 of the first sacrificial patterns 62 may be substantially the same as a distance W12 between opposite surfaces of the first spacer layer 66 positioned on opposite and adjacent sidewalls of the first sacrificial patterns 62. A width W13 of the second sacrificial patterns 64 may be substantially the same as a distance W14 between opposite surfaces of the first spacer layer 66 positioned on opposite and adjacent sidewalls of the second sacrificial patterns 64. The width W11 of the first sacrificial patterns 62, the distance W12 between the first spacer layer 66 covering the sidewalls of the first sacrificial patterns 62, the width W13 of the second sacrificial patterns 64, and the distance W14 between the first spacer layer 66 covering the sidewalls of the second sacrificial patterns 64 may be substantially the same.

Referring to FIG. 2B, first spacers 65 and second spacers 67 may be formed at both sides of the first and second sacrificial patterns 62 and 64. For example, an etch-back process may be performed on the resulting structure with the first spacer layer 66 to remove a portion of the first spacer layer 66, which is formed on a top surface of the buffer layer 58 and top surfaces of the first and second sacrificial patterns 62 and 64. Accordingly, the first spacers 65 may be formed on sidewalls of the first sacrificial patterns 62, and the second spacers 67 may be formed on sidewalls of the second sacrificial patterns 64.

Referring to FIG. 2C, the first sacrificial patterns 62 and the second sacrificial patterns 64 may be selectively removed to expose a portion of the top surface of the buffer layer 58, which has been covered with the first and second sacrificial patterns 62 and 64. Further, the first and second spacers 65 and 67 may remain on the buffer layer 58.

Referring to FIG. 2D, a first mask layer 70 may be formed on the buffer layer 58 provided with the first and second spacers 65 and 67. The first mask layer 70 may be formed on the first, second, and third regions 50a, 50b, and 50c of the substrate 50. Additional mask patterns 77 may be formed on the first mask layer 70 of the third region 50c. Widths of the additional mask patterns 77 may define widths of patterns, which will be formed on the third region 50c of the substrate 50 in a subsequent process. The first mask layer 70 may be, for example, a spin-on-hard mask layer.

Referring to FIG. 2E, the first mask layer 70 exposed by the additional mask pattern 77 may be etched to form first mask patterns 71 on the third region 50c of the substrate 50. The first mask layer 70 may be completely removed from the first and second regions 50a and 50b of the substrate 50 to expose the first spacers 65 and the second spacers 67.

Referring to FIG. 2F, after the formation of the first mask patterns 71, the additional mask patterns 77 may be removed from the third region 50c of the substrate 50. The buffer layer 58 may be patterned to form first to third buffer patterns 57a, 57b, and 57c on the substrate 50. For example, the first buffer patterns 57a may be formed on the first region 50a of the substrate 50, the second buffer patterns 57b may be formed on the second region 50b of the substrate 50, and the third buffer patterns 57c may be formed on the third region 50c of the substrate 50. The first buffer patterns 57a may be formed by etching a portion of the buffer layer 58 exposed by the first spacer 65. The second buffer patterns 57b may be formed by etching a portion of the buffer layer 58 exposed by the second spacer 67. The third buffer patterns 57c may be formed by etching a portion of the buffer layer 58 exposed by the first mask patterns 71. Here, the first spacers 65, the second spacers 67, and the first mask patterns 71 may be formed of a material having an etch selectivity with respect to the buffer layer 58, and thus, they can be used as an etch mask in the process of etching the buffer layer 58. The buffer layer 58 may be selectively removed using an etch recipe having an etch selectivity with respect to the first and second spacers 65 and 67 and the first mask patterns 71.

The first buffer patterns 57a may have a first width LW11, the second buffer patterns 57b may have a second width LW12, and the third buffer patterns 57c may have a third width LW13. The first width LW11 and the second width LW12 may be equal to each other, and the third width LW13 may be larger than the first and second widths LW11 and LW12.

A height H11 of the first spacer 65 may be substantially equal to a height H12 of the second spacer 67, and a height H13 of the first buffer patterns 57a may be substantially equal to a height H14 of the second buffer patterns 57b. The heights H13 and H14 of the first and second buffer patterns 57a and 57b may be smaller than the heights H11 and H12 of the first and second spacers 65 and 67.

Referring to FIG. 2G, the first mask patterns 71 may be removed. Accordingly, top surfaces of the third buffer patterns 57c may be exposed on the third region 50c of the substrate 50. The removal of the first mask patterns 71 may be performed using an ashing process. The first and second spacers 65 and 67 may be removed from the first and second regions 50a and 50b of the substrate 50. Accordingly, top surfaces of the first and second buffer patterns 57a and 57b may be exposed on the first and second regions 50a and 50b of the substrate 50. The removal of the first and second spacers 65 and 67 may be performed by a wet etching process, in which hydrofluoric acid is used.

Referring to FIG. 2H, a second spacer layer 74 may be formed on the resulting structure provided with the first to third buffer patterns 57a, 57b, and 57c. For example, the second spacer layer 74 may be formed to conformally cover a portion of a top surface of the etch stop layer 56 and top and side surfaces of the first to third buffer patterns 57a, 57b, and 57c. The second spacer layer 74 may include a material having an etch selectivity with respect to the first to third buffer patterns 57a, 57b, and 57c and the etch stop layer 56. For example, the second spacer layer 74 may be a silicon nitride layer.

Referring to FIG. 2I, a second mask layer 76 may be formed on the second region 50b of the substrate 50. The second mask layer 76 may be formed to expose the second spacer layer 74 on the first and third regions 50a and 50c of the substrate 50. The second mask layer 76 may include a material having an etch selectivity with respect to the second spacer layer 74. For example, the second mask layer 76 may be an SOH layer.

Referring to FIG. 2J, portions of the second spacer layer 74 exposed by the second mask layer 76 may be selectively removed from the first and third regions 50a and 50c of the substrate 50 to expose the first buffer patterns 57a, the third buffer patterns 57c, and a portion of the top surface of the etch stop layer 56. The removal of the second spacer layer 74 may be performed using a wet etching process. For example, phosphoric acid ($H_3PO_4$) solution may be used to remove the second spacer layer 74. Here, other portion of the second spacer layer 74, which is formed on the second region 50b of the substrate 50, may be protected by the second mask layer 76 and thus, may not be removed by the etching solution.

Referring to FIG. 2K, the second mask layer 76 may be removed from the second region 50b of the substrate 50. Thereafter, an etch-back process may be performed on the second spacer layer 74 to form fourth spacers 78 at both sides of the second buffer patterns 57b.

Referring to FIG. 2L, the etch stop layer 56 may be patterned to form first stop patterns 55a, second stop patterns 55b, and third stop patterns 55c. For example, a portion of the etch stop layer 56 exposed by the first buffer patterns 57a may be etched to form the first stop patterns 55a on the first region 50a of the substrate 50. A portion of the etch stop layer 56 exposed by the second buffer patterns 57b and the fourth spacer 78 may be etched to form the second stop patterns 55b on the second region 50b of the substrate 50. A portion of the etch stop layer 56 exposed by the third buffer patterns 57c may be etched to form the third stop patterns 55c on the third region 50c of the substrate 50.

A width LW14 of the first stop patterns 55a may be smaller than a width LW15 of the second stop patterns 55b, and the width LW15 of the second stop patterns 55b may be smaller than a width LW16 of the third stop patterns 55c. The width LW15 of the second stop patterns 55b may be substantially equal to a sum of the width LW12 of the second buffer patterns 57b and a width SW11 of the fourth spacer 78.

Referring to FIG. 2M, the hard mask layer 54 may be patterned to form first hard mask patterns 53a, second hard mask patterns 53b, and third hard mask patterns 53c. For example, a portion of the hard mask layer 54 exposed by the first stop patterns 55a may be etched to form the first hard mask patterns 53a on the first region 50a of the substrate 50. A portion of the hard mask layer 54 exposed by the second stop patterns 55b may be etched to form the second hard mask patterns 53b on the second region 50b of the substrate 50. A portion of the hard mask layer 54 exposed by the third stop patterns 55c may be etched to form the third hard mask patterns 53c on the third region 50c of the substrate 50. When the hard mask layer 54 is etched, the first to third buffer patterns 57a, 57b, and 57c may be etched along with the hard mask layer 54. After the formation of the first to third hard mask patterns 53a, 53b, and 53c, the first to third buffer patterns 57a, 57b, and 57c may be selectively removed. Accordingly, top surfaces of the first to third stop patterns 55a, 55b, and 55c may be exposed.

Referring to FIG. 2N, the insulating layer 52 and the substrate 50 exposed by the first to third hard mask patterns 53a, 53b, and 53c may be sequentially etched to form first to third insulating patterns 51a, 51b, and 51c and first to third fins 102a, 102b, and 102c. For example, on the first region 50a, the insulating layer 52 and an upper portion of the substrate 50 may be etched using the first hard mask patterns 53a, which are formed on the first region 50a, as an etch mask. Accordingly, the first insulating patterns 51a and the first fins 102a may be formed on the first region 50a of the substrate 50. On the second region 50b, the insulating layer 52 and the upper portion of the substrate 50 may be etched using the second hard mask patterns 53b, which are formed on the second region 50b, as an etch mask. Accordingly, the second insulating patterns 51b and the second fins 102b may be formed on the second region 50b of the substrate 50. On the third region 50c, the insulating layer 52 and the upper portion of the substrate 50 may be etched using the third hard mask patterns 53c, which are formed provided on the third region 50c, as an etch mask. Accordingly, the third insulating patterns 51c and the third fins 102c may be formed on the third region 50c of the substrate 50. The first to third fins 102a, 102b, and 102c may protrude upward from the recessed top surfaces of the substrate 50a.

The first to third stop patterns 55a, 55b, and 55c on the first to third hard mask patterns 53a, 53b, and 53c may also be etched, during the etching of the insulating layer 52 and the upper portion of the substrate 50.

Referring to FIG. 2O, the first to third hard mask patterns 53a, 53b, and 53c and the first to third insulating patterns 51a, 51b, and 51c may be removed to expose top surfaces of the first to third fins 102a, 102b, and 102c. The first fins 102a may have substantially the same width as the width LW14 of the first stop patterns 55a, the second fins 102b may have substantially the same width as the width LW15 of the second stop patterns 55b, and the third fins 102c may have substantially the same width as the width LW16 of the third stop patterns 55c. Thus, the first fin 102a may have a width smaller than that of the second fin 102b, and the second fin 102b may have a width smaller than that of the third fin 102c.

FIGS. 3A through 6A are plan views illustrating a process of fabricating a semiconductor device using a fabrication method according to example embodiments of the inventive concept. FIGS. 3B through 6B are diagrams, each of which has vertical sections taken along lines I-I', II-II', and III-III' of FIGS. 3A through 6A, and FIGS. 3C through 6C are diagrams, each of which has vertical sections taken along lines IV-IV', V-V', and VI-VI' of FIGS. 3A through 6A.

Figure 3A:
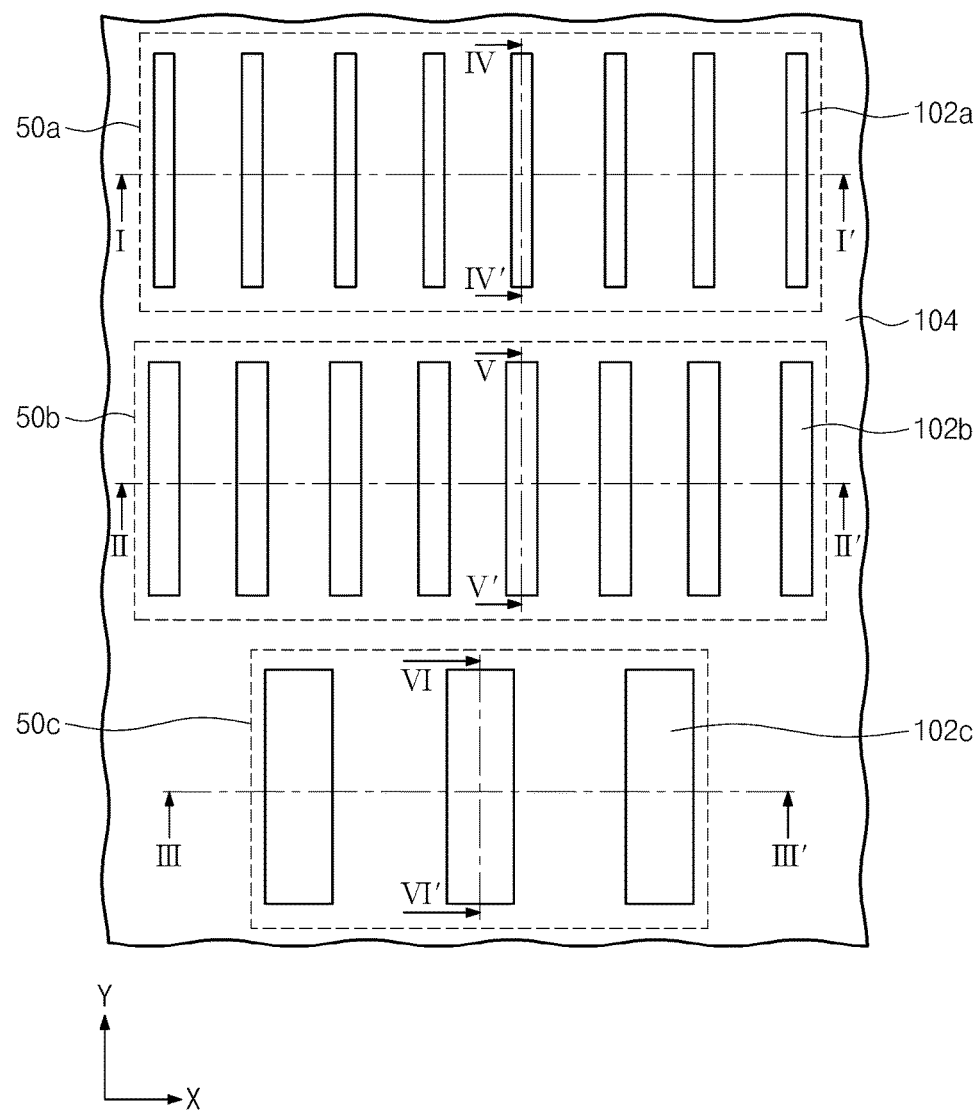
Figure 3B:
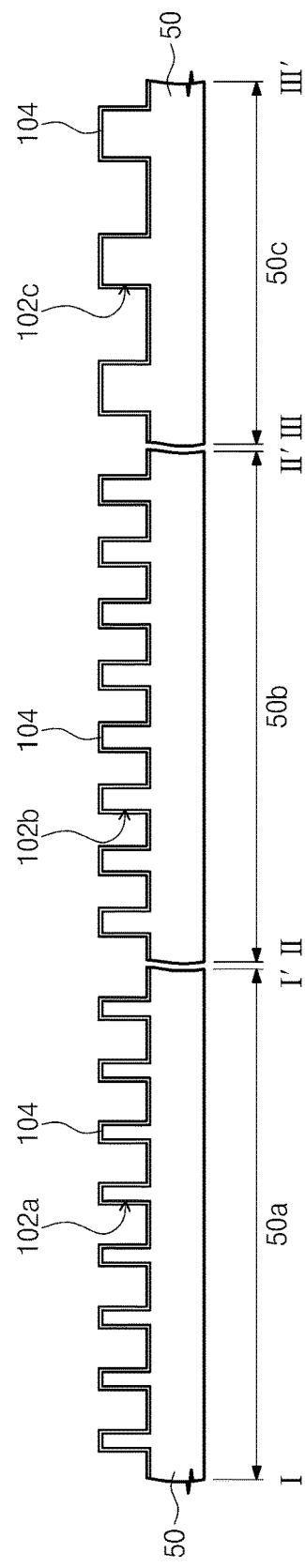
Figure 3C:
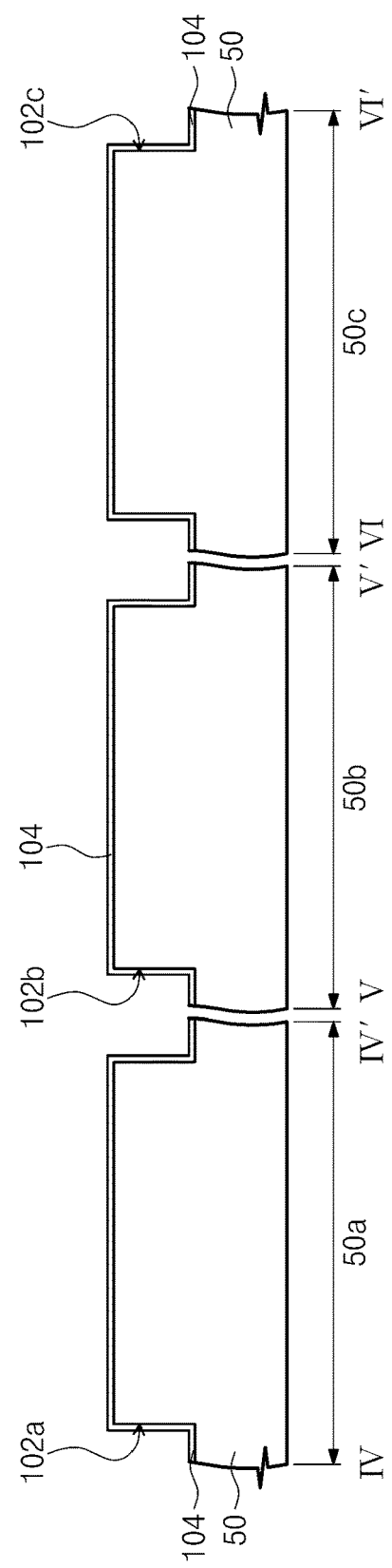

Referring to FIGS. 3A through 3C, a plurality of first fins 102a formed by using a double patterning process described with reference to FIGS. 2A through 2O may be formed on the first region 50a of the substrate 50, a plurality of second fins 102b formed by using the double patterning process described with reference to FIGS. 2A through 2O may be formed on the second region 50b of the substrate 50, and a plurality of third fins 102c formed by using the double patterning process described with reference to FIGS. 2A through 2O may be formed on the third region 50c of the substrate 50. The first fins 102a may be disposed spaced apart from each other on the first region 50a and parallel to a first or X direction, the second fins 102b may be disposed spaced apart from each other on the second region 50b and parallel to a first or X direction, and the third fins 102c may be disposed spaced apart from each other on the third region 50c and parallel to the first or X direction.

An insulating layer 104 may be formed on the substrate 50 to conformally cover the first to third fins 102a, 102b, and 102c. The insulating layer 104 may be, for example, a silicon oxide layer or a thermal oxide layer. The insulating layer 104 may be used as a gate insulating layer of a MOS FET.

Figure 4A:
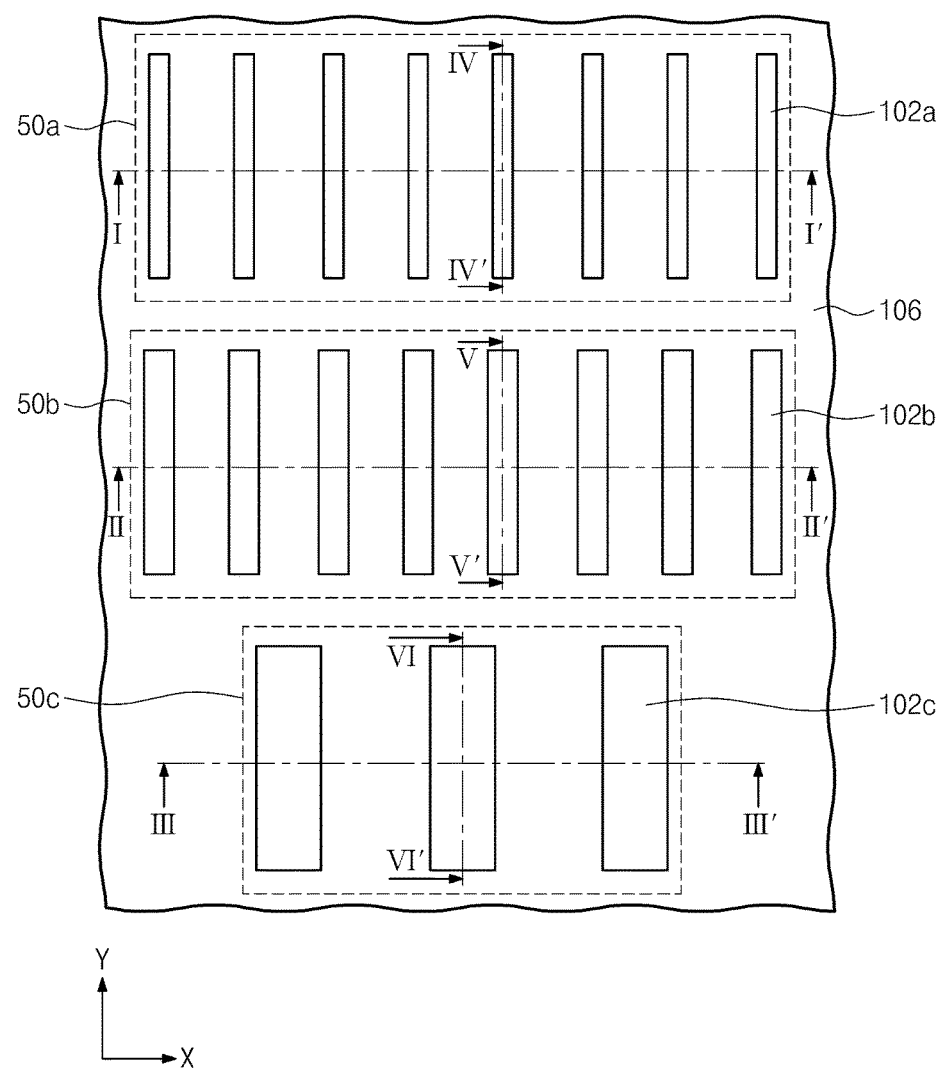
Figure 4B:
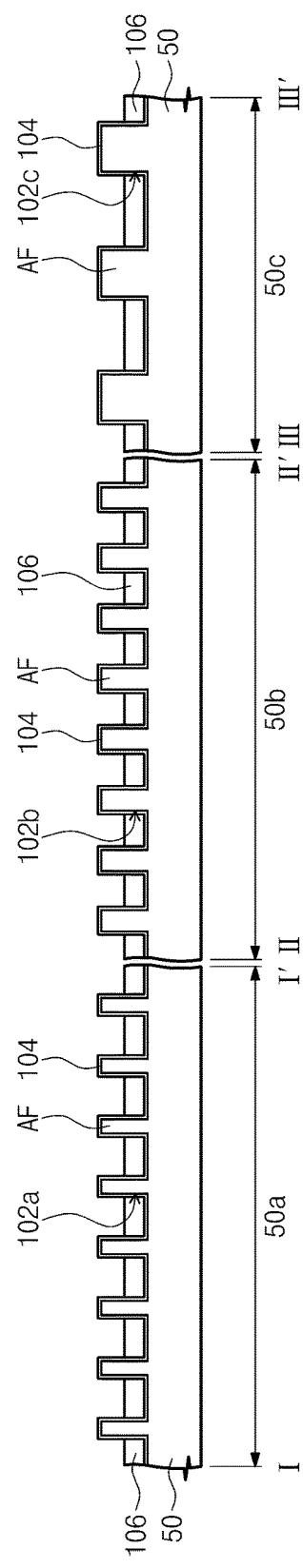
Figure 4C:
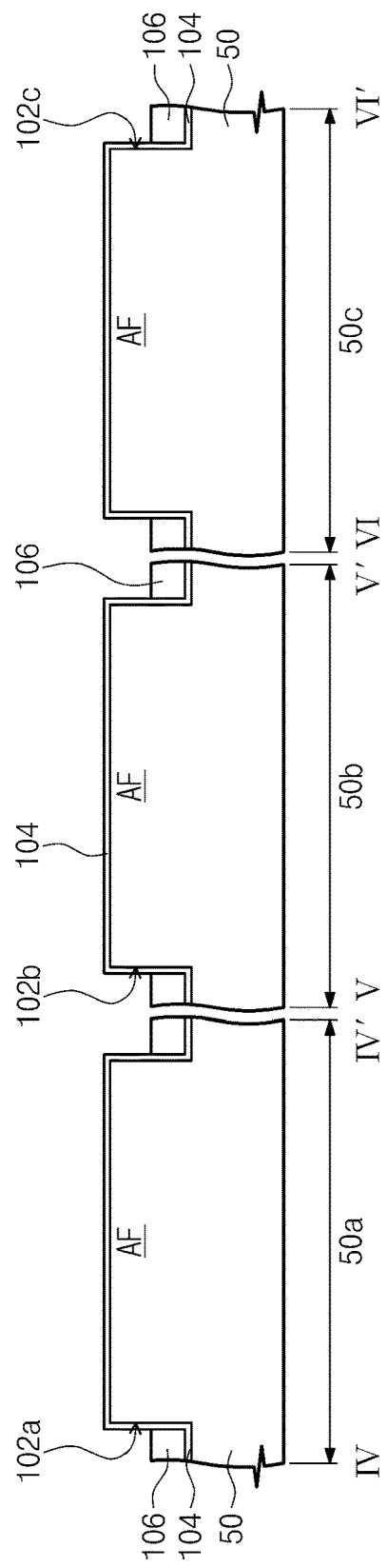

Referring to FIGS. 4A through 4C, a device isolation layer 106 may be formed on the substrate 50. The device isolation layer 106 may define active fins AF of the substrate 5. For example, the device isolation layer 106 may be formed by forming an insulating layer (not shown) on the substrate 50 and etching the insulating layer. Here, the device isolation layer 106 may be formed to have a top surface positioned below the top surfaces of the first to third fins 102a, 102b, and 102c. The device isolation layer 106 may be formed on the recessed top surface of the substrate 50 to fill the recess regions between the first fins 102a, between the second fins 102b, and between the third fins 102c. The device isolation layer 106 may be formed of or include, for example, a silicon oxide layer.

Figure 5A:
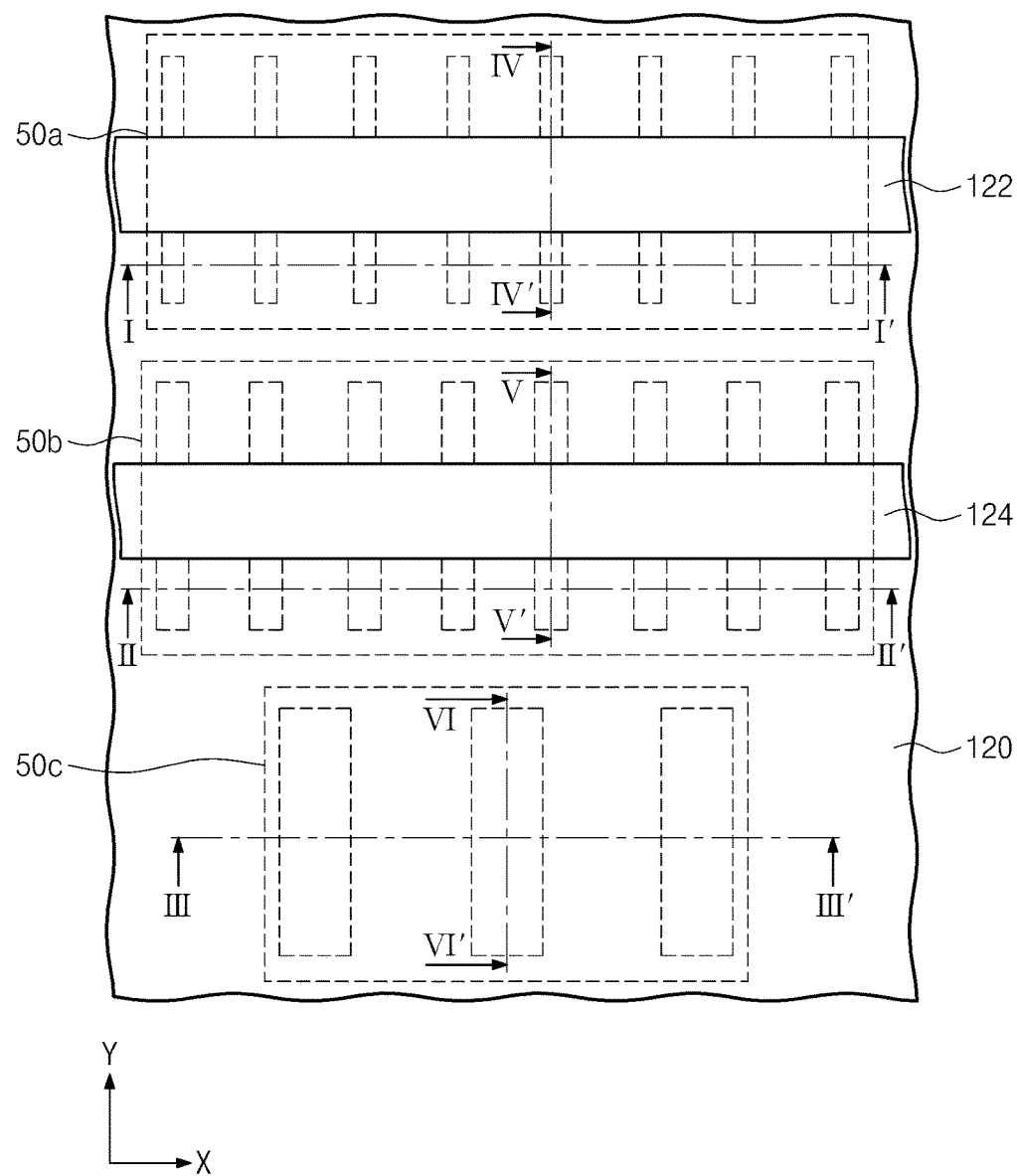
Figure 5B:
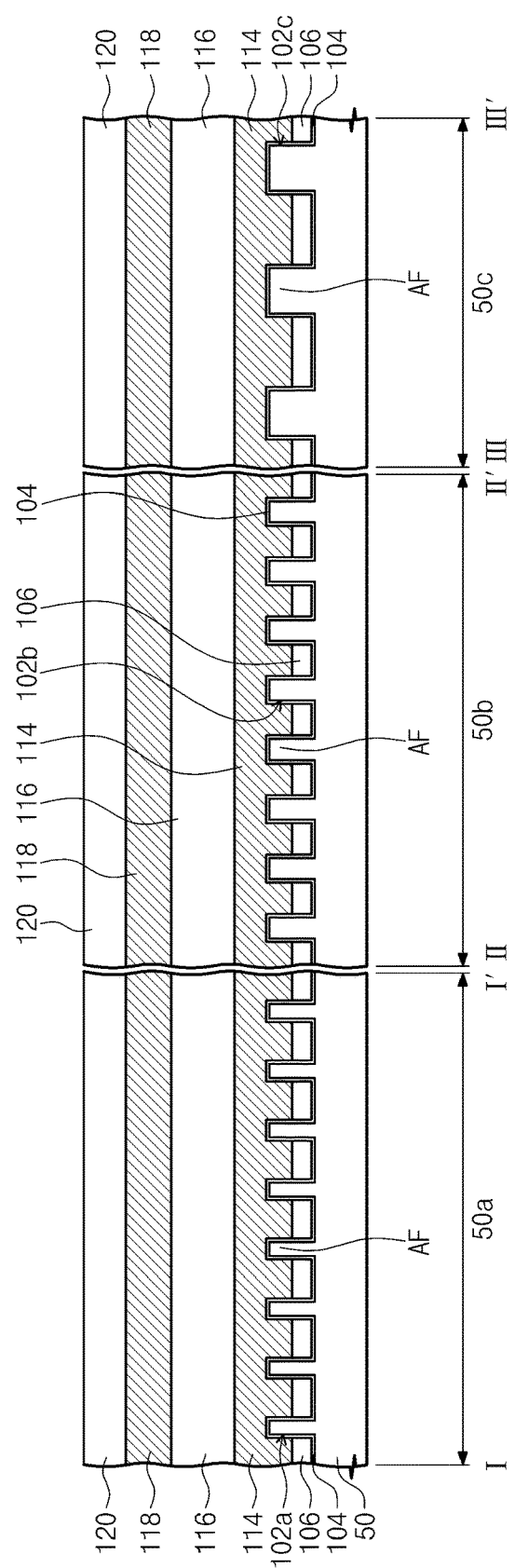
Figure 5C:
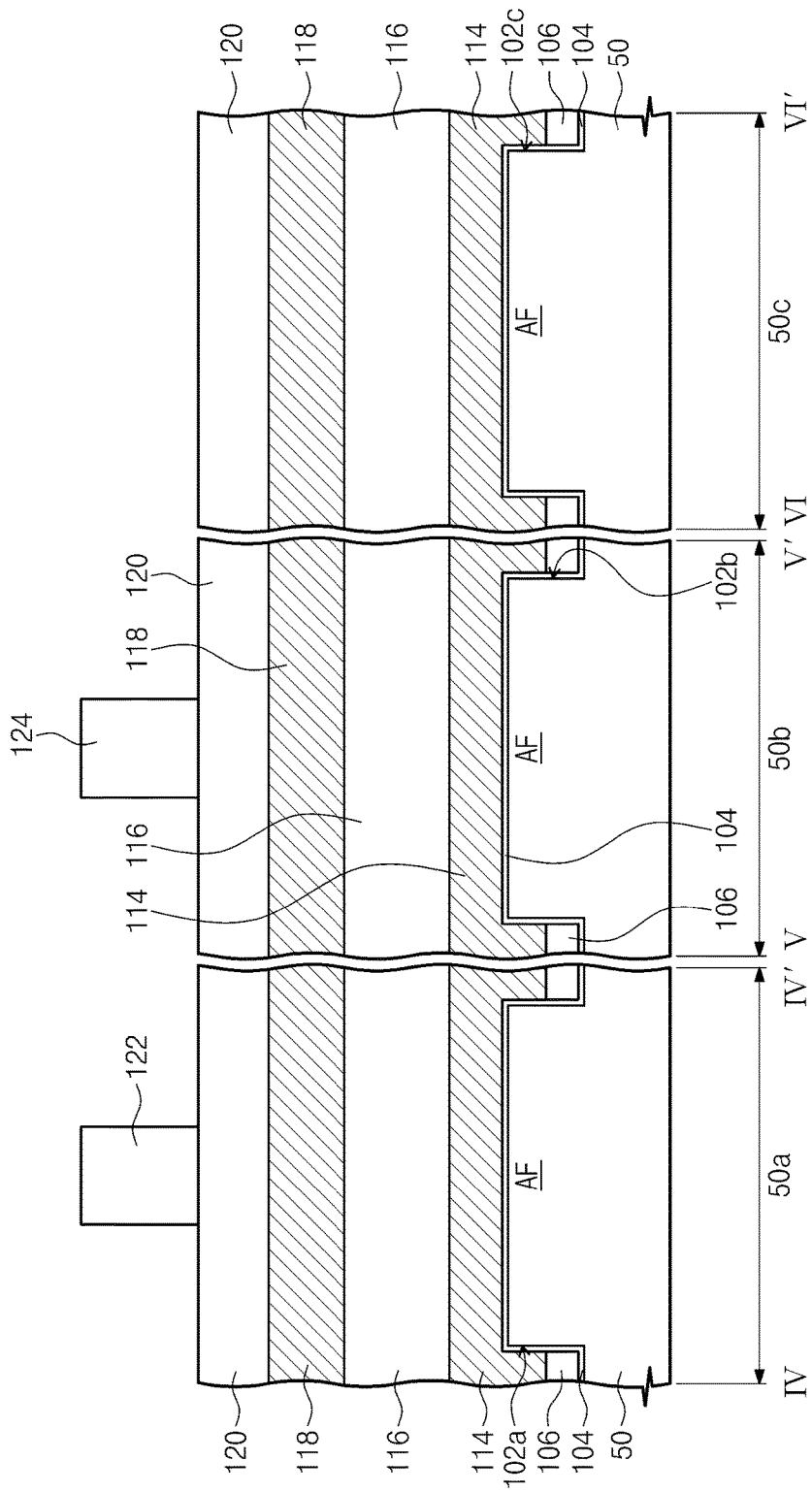

Referring to FIGS. 5A through 5C, a conductive layer 114, a lower etch stop layer 116, a buffer layer 118, and an upper etch stop layer 120 may be sequentially formed on the substrate 50. Thereafter, as shown in FIG. 5C, first sacrificial patterns 122 and second sacrificial patterns 124 may be formed on the upper etch stop layer 120. The first sacrificial patterns 122 may be formed on the first region 50a of the substrate 50, and the second sacrificial patterns 124 may be formed on the second region 50b of the substrate 50. The first sacrificial patterns 122 may be formed to cross the first fins 102a, and the second sacrificial patterns 124 may be formed to cross the second fins 102b. Next, the first spacer layer 26 of FIG. 1A may be formed to conformally cover the first and second sacrificial patterns 122 and 124.

Figure 6A:
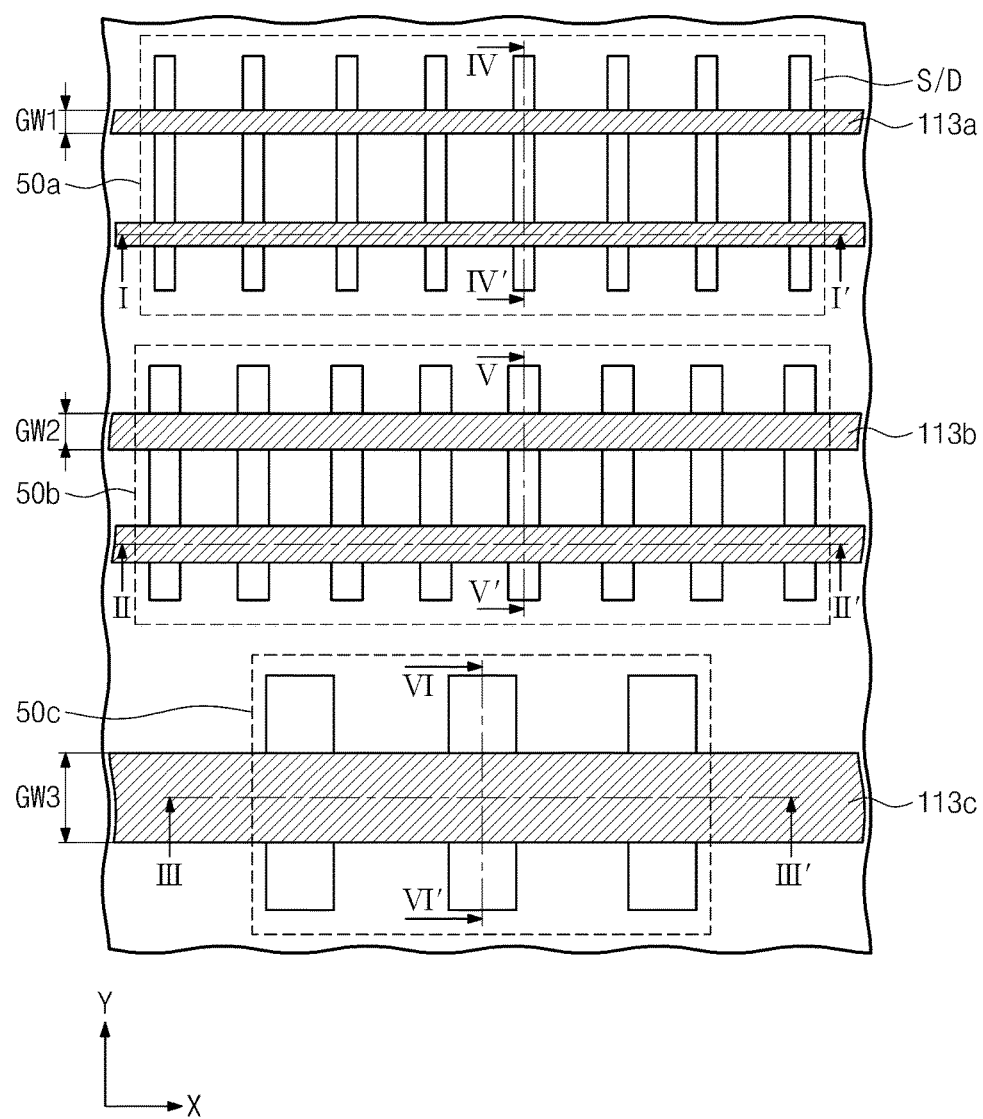
Figure 6B:
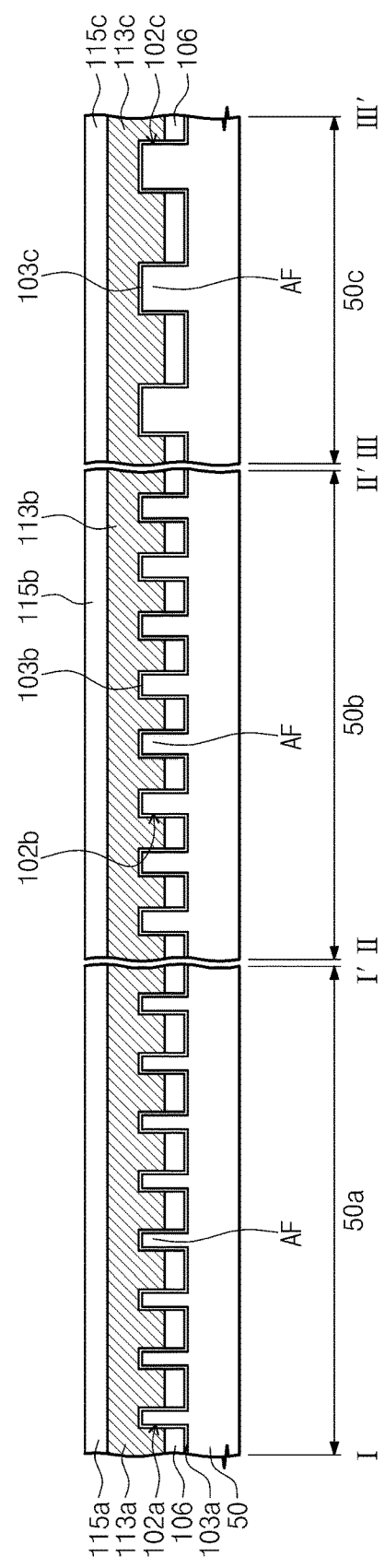
Figure 6C:
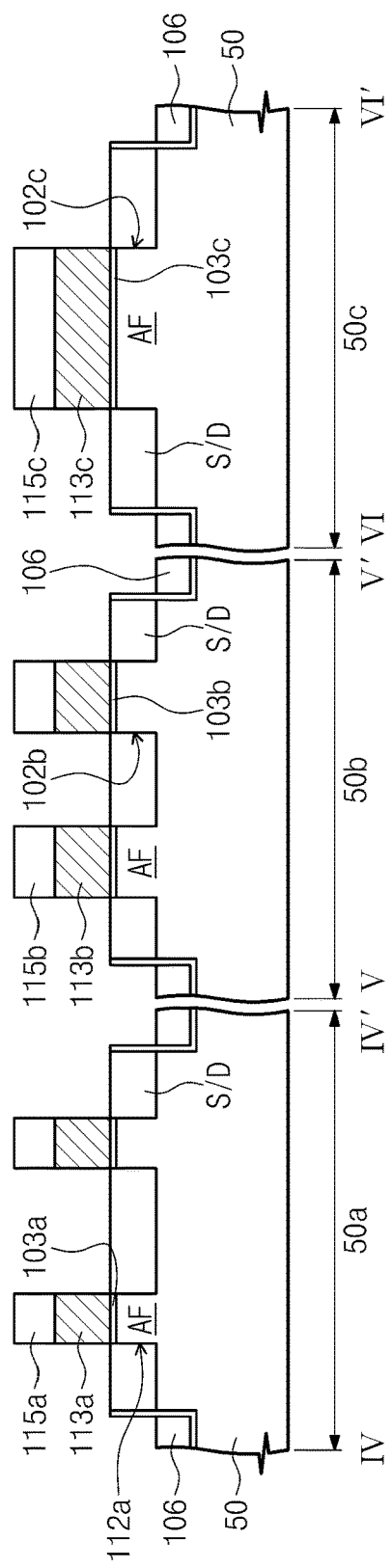

Thereafter, the process steps described with reference to FIGS. 1B through 1N may be performed on the resulting structure provided with the first spacer layer 26, in the substantially identical manner, and thus, first to third insulating patterns 103a, 103b, and 103c and first to third conductive patterns 113a, 113b, and 113c may be formed on the substrate 50, as shown in FIGS. 6A through 6C. For example, the first insulating patterns 103a and the first conductive patterns 113a may be formed on the first region 50a of the substrate 50, the second insulating patterns 103b and the second conductive patterns 113b may be formed on the second region 50b of the substrate 50, and the third insulating patterns 103c and the third conductive patterns 113c may be formed on the third region 50c of the substrate 50. The first conductive patterns 113a may be formed to cross the first fins 102a and extend parallel to the first or X direction. The second conductive patterns 113b may be formed to cross the second fins 102b and extend parallel to the first or X direction. The third conductive patterns 113c may be formed to cross the third fins 102c and extend parallel to the first or X direction. In certain embodiments, first lower patterns 115a may remain on the first conductive patterns 113a, respectively, and second lower patterns 115b may remain on the second conductive patterns 113b, respectively. Similarly, third lower patterns 115c may remain on the third conductive patterns 113c, respectively. A width GW1 of the first conductive pattern 113a may be smaller than a width GW2 of the second conductive pattern 113b, and the width GW2 of the second conductive pattern 113b may be smaller than a width GW3 of the third conductive pattern 113c. In certain embodiments, the first to third insulating patterns 103a, 103b, and 103c may be used as gate insulating patterns of MOS FETs, and the first to third conductive patterns 113a, 113b, and 113c may be used as gate electrodes of the MOS FETs.

The source/drain region S/D may be formed in the active fins AF of the substrate 50. The first to third lower patterns 115a, 115b, and 115c may be used as an etch mask in the process of forming the source/drain region S/D.

By using a double patterning process according to example embodiments of the inventive concept, it is possible to form fin-FETs including fins with at least two different widths and conductive patterns with at least two different widths.

FIGS. 7A through 7J are sectional views illustrating a method of fabricating a semiconductor device according to other example embodiments of the inventive concept.

For concise description, a previously described element may be identified by a similar or identical reference number without repeating an overlapping description thereof.

Figure 7A:
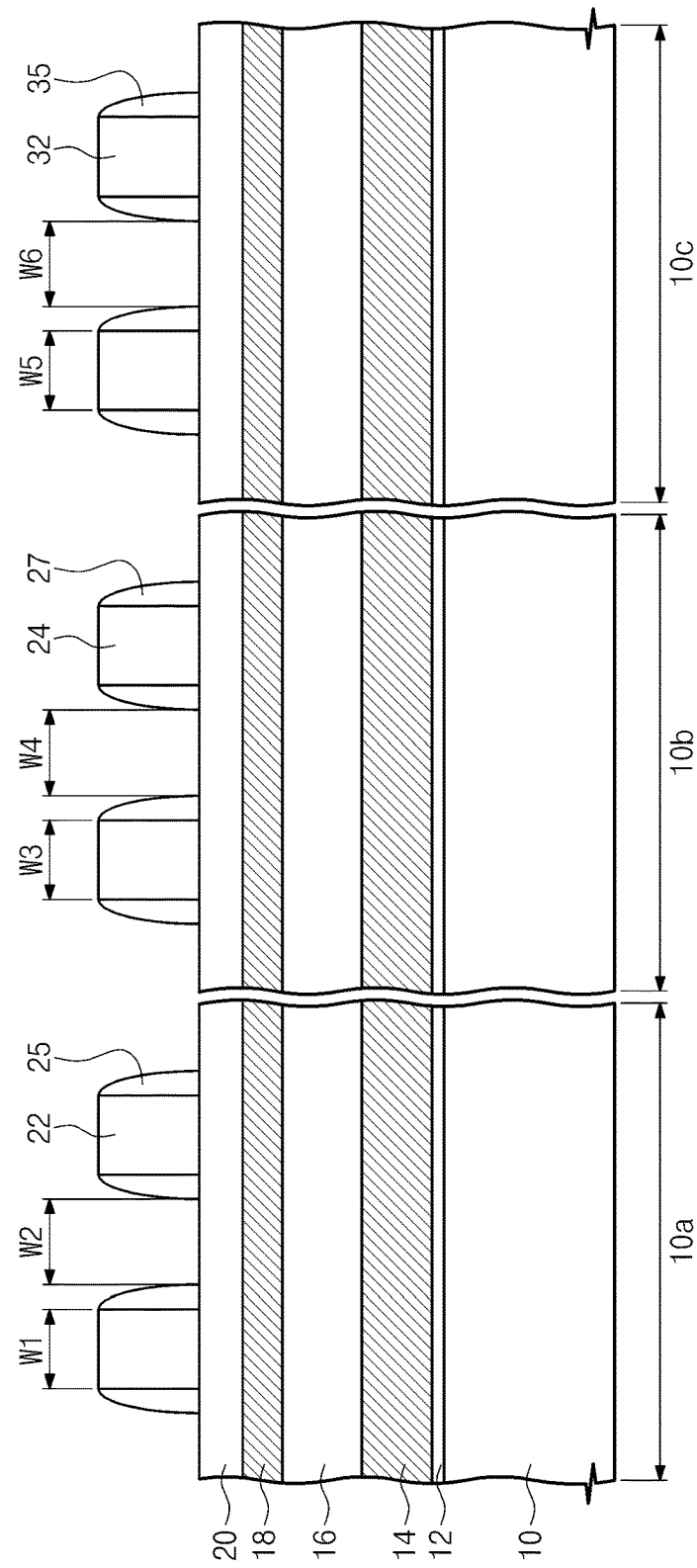

Referring to FIG. 7A, the first spacers 25, the second spacers 27, and third spacers 35 may be formed on the substrate 10. For example, the first sacrificial patterns 22, the second sacrificial patterns 24, and third sacrificial patterns 32 may be formed on the upper etch stop layer 20, and the first spacer layer 26 (for example, see FIG. 1A) may be formed to conformally cover the first to third sacrificial patterns 22, 24, and 32. An etch-back process may be performed on the first spacer layer 26 to form the first, second, and third spacers 25, 27, and 35 on both sidewalls of the first, second, and third sacrificial patterns 22, 24, and 32, respectively.

A width W1 of each of the first sacrificial patterns 22 may be substantially equal to a distance (hereinafter, a width W2) between an adjacent pair of the first spacers 25. A width W3 of each of the second sacrificial patterns 24 may be substantially equal to a distance (hereinafter, a width W4) between an adjacent pair of the second spacers 27. A width W5 of each of the third sacrificial patterns 32 may be substantially equal to a distance (hereinafter, a width W6) between an adjacent pair of the third spacers 35. Further, according to example embodiments of the inventive concept, the widths W1, W2, W3, W4, W5, and W6 may be substantially the same as each other.

Figure 7B:
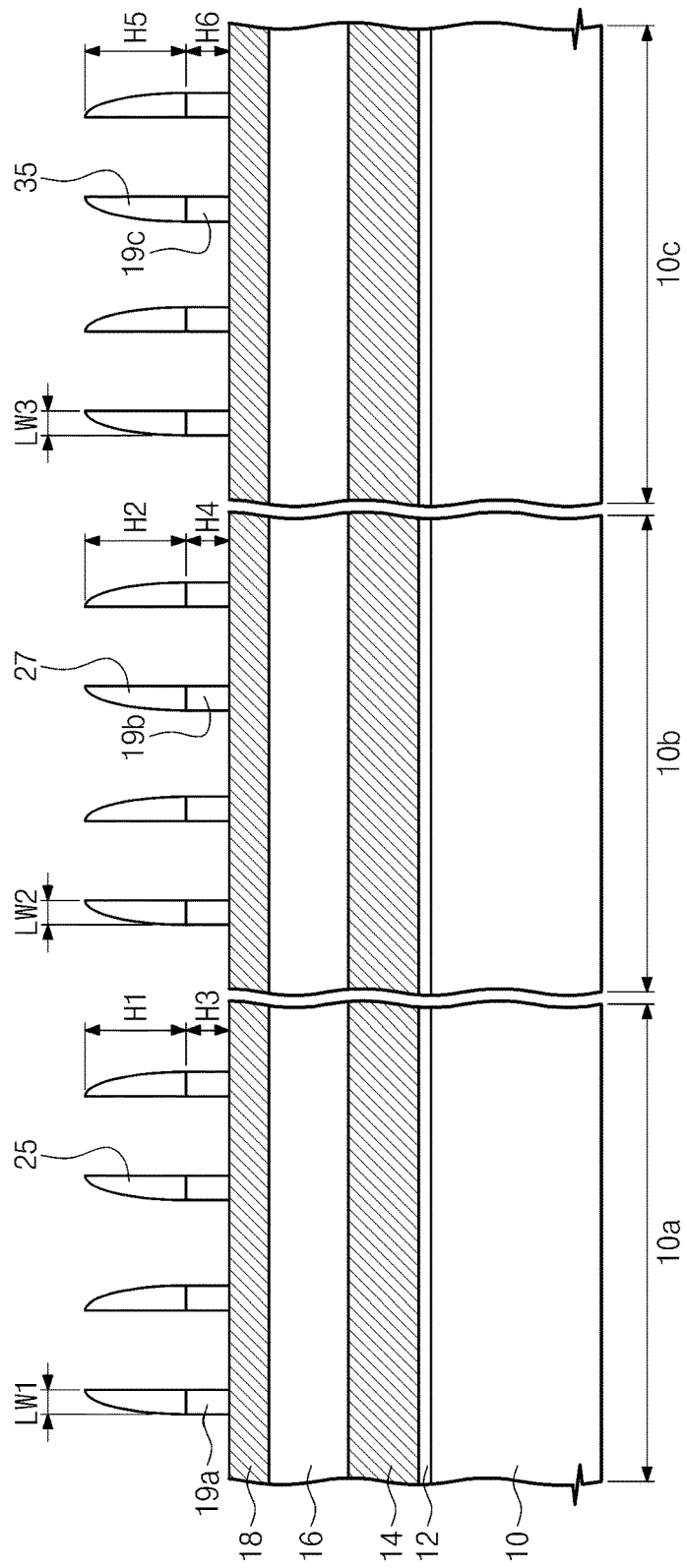

Referring to FIG. 7B, the upper etch stop layer 20 may be patterned to form the first to third upper patterns 19a, 19b, and 19c. For example, the upper etch stop layer 20 exposed by the first spacers 25 may be etched to form the first upper patterns 19a on the first region 10a of the substrate 10. The upper etch stop layer 20 exposed by the second spacers 27 may be etched to form the second upper patterns 19b on the second region 10b of the substrate 10. The upper etch stop layer 20 exposed by the third spacers 35 may be etched to form the third upper patterns 19c on the third region 10c of the substrate 10. The first upper pattern 19a may be formed to have a width LW1, the second upper pattern 19b may be formed to have a width LW2, and the third upper pattern 19c may be formed to have a width LW3. Here, the widths LW1, LW2, and LW3 may be substantially the same as each other.

A height H1 of the first spacer 25, a height H2 of the second spacer 27, and a height H5 of the third spacer 35 may be substantially the same as each other, and a height H3 of the first upper pattern 19a, a height H4 of the second upper pattern 19b, and a height H6 of the third upper pattern 19c may be substantially the same as each other. The heights H3, H4, and H6 of the first to third upper patterns 19a, 19b, and 19c may be smaller than the heights H1, H2, and H5 of the first to third spacers 25, 27, and 32.

Figure 7C:
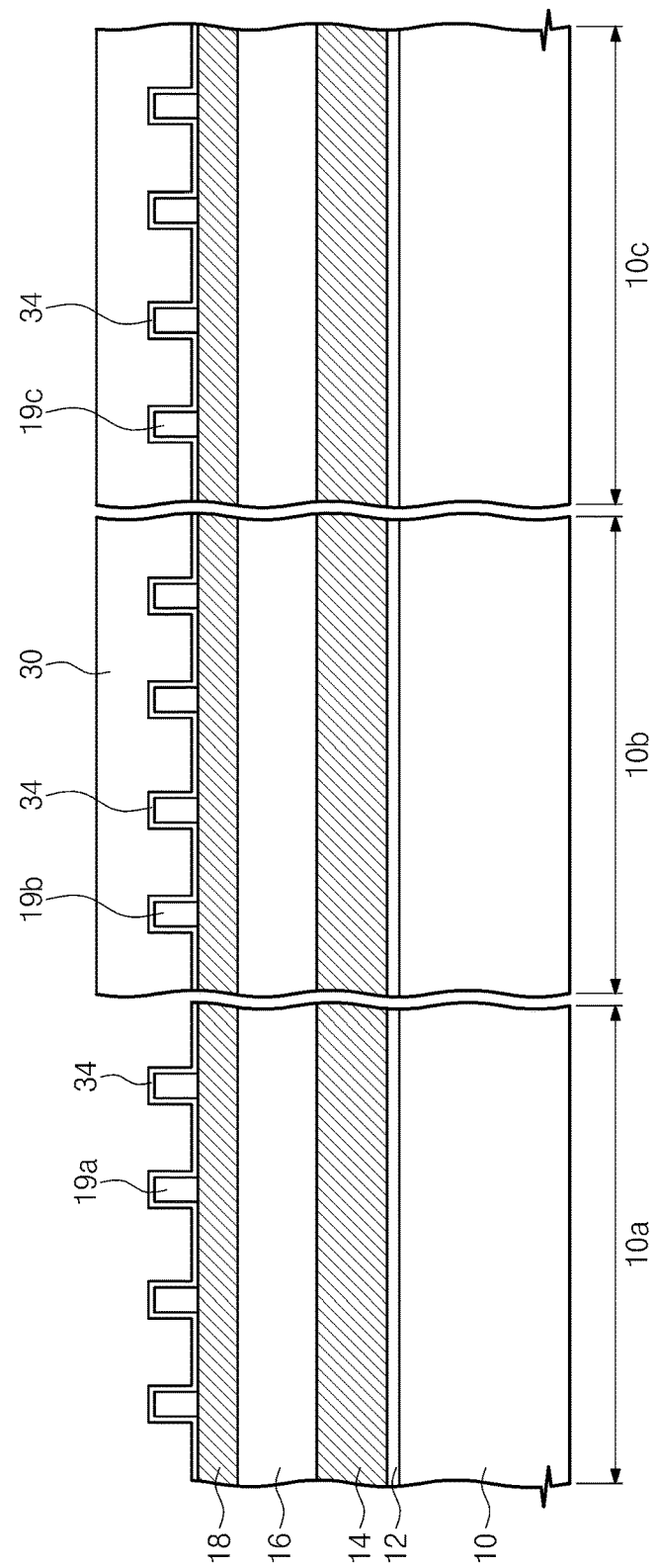

Referring to FIG. 7C, the second spacer layer 34 may be formed on the substrate 10 provided with the first to third upper patterns 19a, 19b, and 19c. The second spacer layer 34 may be formed to conformally cover the first to third upper patterns 19a, 19b, and 19c. The second spacer layer 34 may be, for example, a silicon oxide layer.

The first mask layer 30 may be formed on the second and third regions 10b and 10c of the substrate 10. The first mask layer 30 may be formed to cover the second spacer layer 34 on the second and third regions 10b and 10c and expose the second spacer layer 34 on the first region 10a of the substrate 10. The first mask layer 30 may be formed of or include, for example, a SOH layer.

Figure 7D:
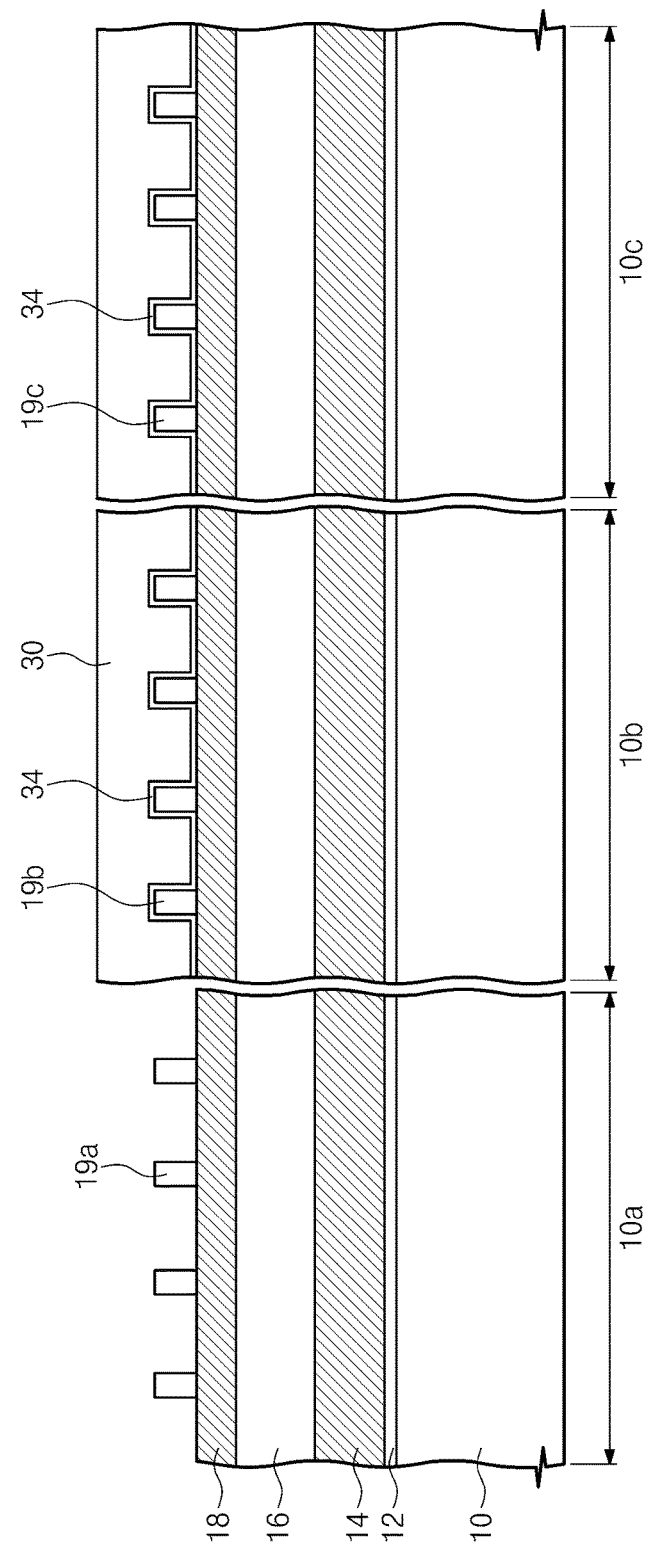

Referring to FIG. 7D, the second spacer layer 34 exposed by the first mask layer 30 may be removed to expose the first upper pattern 19a. The second spacer layer 34 may be removed using a wet etching process.

Figure 7E:
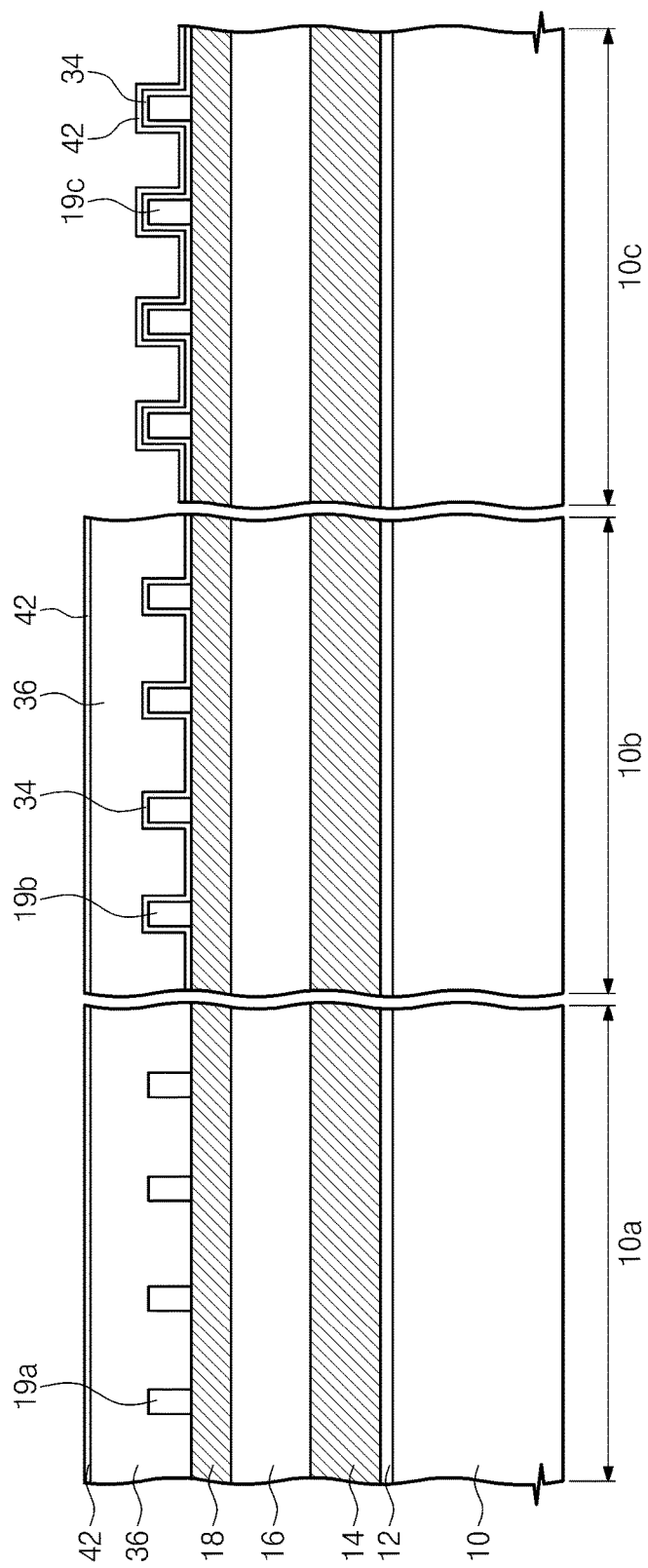

Referring to FIG. 7E, the second mask layer 36 may be formed on the first and second regions 10a and 10b of the substrate 10. For example, the first mask layer 30 may be removed from the second and third regions 10b and 10c of the substrate 10, thereby exposing a portion of the second spacer layer 34. Thereafter, the second mask layer 36 may be formed on the first and second regions 10a and 10b of the substrate 10. The second mask layer 36 may be formed to cover the first upper pattern 19a on the first region 10a and cover the second spacer layer 34 on the second region 10b. Further, the second mask layer 36 may be formed to expose the second spacer layer 34 on the third region 10c. The second mask layer 36 may be formed, for example, of the same material as the first mask layer 30.

A third spacer layer 42 may be formed on the substrate 10. The third spacer layer 42 may be formed to cover the second mask layer 36 on the first and second regions 10a and 10b of the substrate 10. Further, the third spacer layer 42 may be formed on the third region 10c of the substrate 10 to conformally cover the second spacer layer 34, which is provided to conformally cover the third upper patterns 19c. The third spacer layer 42 may be formed to have substantially the same thickness as the second spacer layer 34, but example embodiments of the inventive concept are not limited thereto. The third spacer layer 42 may be formed, for example, of the same material as the second spacer layer 34.

Figure 7F:
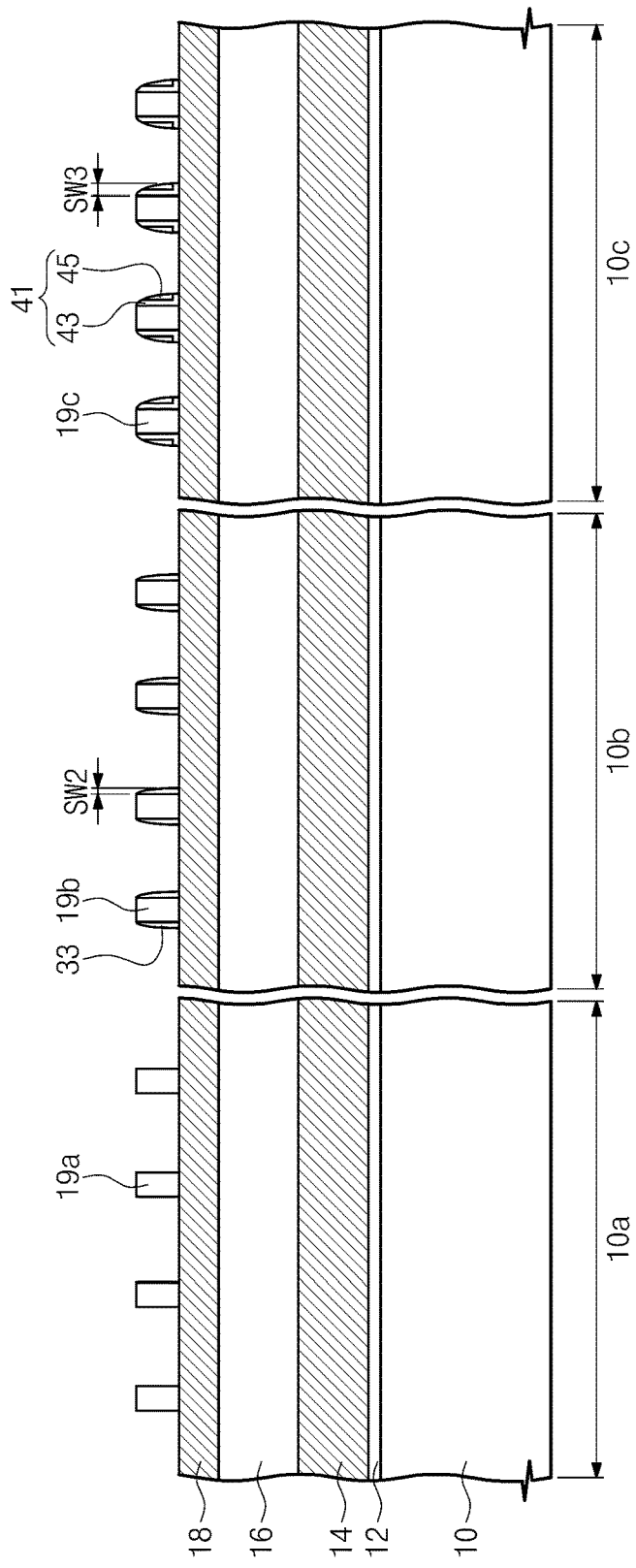

Referring to FIG. 7F, the second mask layer 36 may be removed. Accordingly, the first upper pattern 19a may be exposed on the first region 10a of the substrate 10, the second spacer layer 34 covering the second upper pattern 19b may be exposed on the second region 10b of the substrate 10, and the third spacer layer 42 covering the third upper pattern 19c may be exposed on the third region 10c of the substrate 10. The third spacer layer 42 may be lifted off from the first and second regions 10a and 10b of the substrate 10, when the second mask layer 36 is removed using an ashing process.

An etch-back process may be performed to form fifth and sixth spacers 33 and 41 on the second and third regions 10b and 10c, respectively, of the substrate 10. The fifth spacers 33 may be formed on sidewalls of each of the second upper patterns 19b, and the sixth spacers 41 may be formed on sidewalls of each of the third upper patterns 19c. Here, each of the sixth spacers 41 may include a second pattern 43, which is a part of the second spacer layer 34, and a third pattern 45, which is a part of the third spacer layer 42. Accordingly, a width SW3 of the second spacer 41 may be greater than a width SW2 of the fifth spacer 33.

Referring to FIG. 7G, the buffer layer 18 may be patterned to form the first to third buffer patterns 17a, 17b, and 17c. For example, the buffer layer 18 exposed by the first upper patterns 19a may be etched to form the first buffer patterns 17a on the first region 10a of the substrate 10. The buffer layer 18 exposed by the second upper patterns 19b and the fifth spacers 33 may be etched to form the second buffer patterns 17b on the second region 10b of the substrate 10. The buffer layer 18 exposed by the third upper patterns 19c and the sixth spacers 41 may be etched to form the third buffer patterns 17c on the third region 10c of the substrate 10. A width LW4 of the first buffer pattern 17a may be smaller than a width LW5 of the second buffer pattern 17b. The width LW5 of the second buffer pattern 17b may be smaller than a width LW6 of the third buffer pattern 17c. For example, the width LW5 of the second buffer pattern 17b may be substantially equal to a sum of widths of the second upper pattern 19b and the fifth spacers 33 disposed on both sidewalls thereof (i.e., LW5=LW2+2×SW2). The width LW6 of the third buffer pattern 17c may be substantially equal to a sum of widths of the third upper pattern 19c and the sixth spacers 41 disposed on both sidewalls thereof (i.e., LW6=LW3+2×SW3).

Referring to FIG. 7H, the lower etch stop layer 16 may be patterned to form the first to third lower patterns 15a, 15b, and 15c. For example, the first lower patterns 15a may be formed on the first region 10a of the substrate 10, the second lower patterns 15b may be formed on the second region 10b of the substrate 10, and the third lower patterns 15c may be formed on the third region 10c of the substrate 10. During the etching process of the lower etch stop layer 16, the first to third upper patterns 19a, 19b, and 19c may be removed to expose top surfaces of the first to third buffer patterns 17a, 17b, and 17c.

Figure 7I:
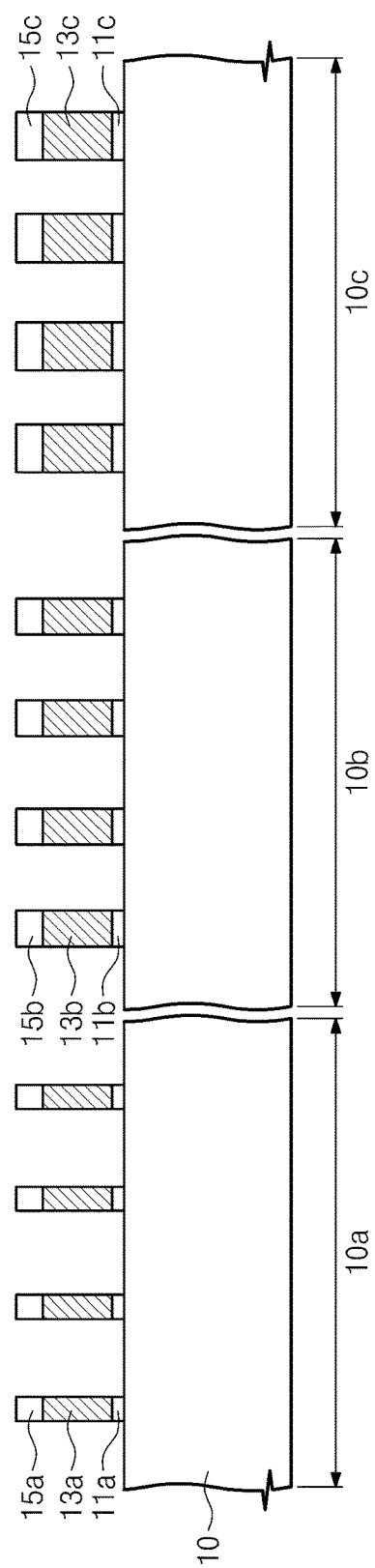

Referring to FIG. 7I, the conductive layer 14 may be patterned to form the first to third conductive patterns 13a, 13b, and 13c. For example, the first conductive patterns 13a may be formed on the first region 10a of the substrate 10, the second conductive pattern 13b may be formed on the second region 10b of the substrate 10, and the third conductive pattern 13c may be formed on the third region 10c of the substrate 10. During the etching process of the conductive layer 14, the first to third buffer patterns 17a, 17b, and 17c may be removed to expose top surfaces of the first to third lower patterns 15a, 15b, and 15c. The first conductive pattern 13a may be formed to have substantially the same width as the width LW4 of the first buffer pattern 17a, the second conductive pattern 13b may be formed to have substantially the same width as the width LW5 of the second buffer pattern 17b, and the third conductive pattern 13c may be formed to have substantially the same width as the width LW6 of the third buffer pattern 17c.

The insulating layer 12 exposed by the first to third conductive patterns 13a, 13b, and 13c may be etched. As a result of the etching of the insulating layer 12, the first, second, and third insulating patterns 11a, 11b, and 11c may be formed on the first, second, and third regions 10a, 10b, and 10c, respectively, of the substrate 10.

Figure 7J:
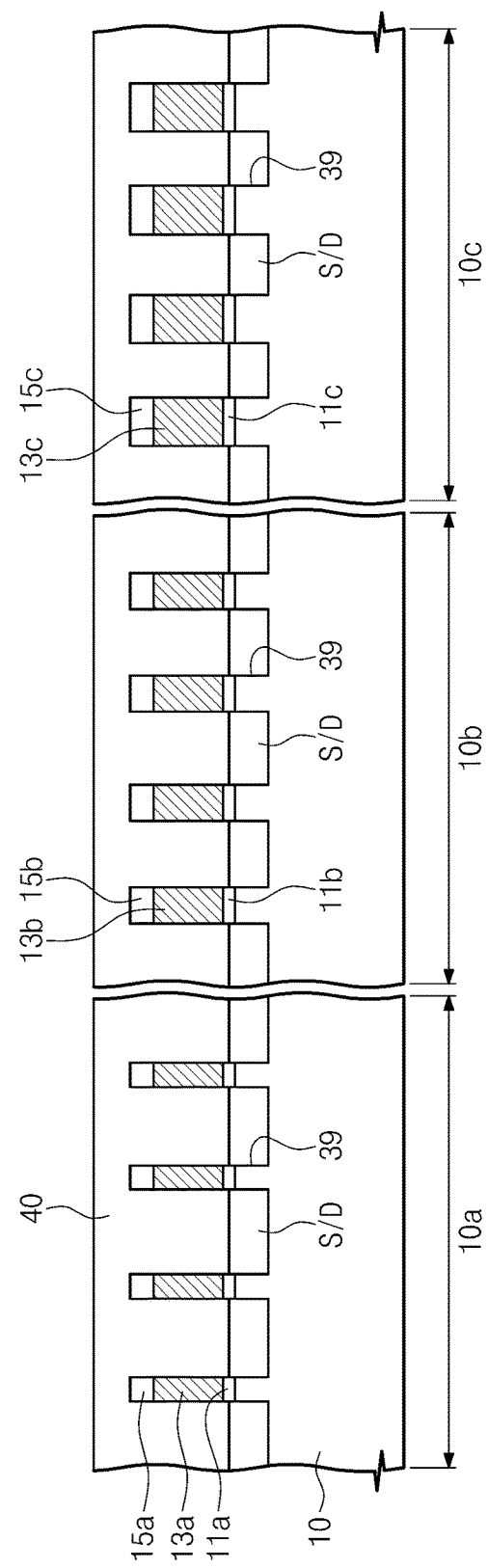

Referring to FIG. 7J, the recess regions 39 may be formed on the top surface of the substrate 10 exposed by the first to third insulating patterns 11a, 11b, and 11c, and the source/drain regions S/D may be formed in the recess regions 39, respectively. In certain embodiments, the recess regions 39 may be formed by anisotropically etching the exposed top surface of the substrate 10 using the first to third lower patterns 15a, 15b, and 15c as an etch mask. After the formation of the source/drain regions S/D, the interlayered insulating layer 40 may be formed on the substrate 10 to cover the first to third conductive patterns 13a, 13b, and 13c.

In the above-described embodiments, the first to third insulating patterns 11a, 11b, and 11c may be used as gate insulating patterns of MOS transistors, and the second to third conductive patterns 13a, 13b, and 13c may be used as gate electrodes of the MOS transistors.

Figure 8:
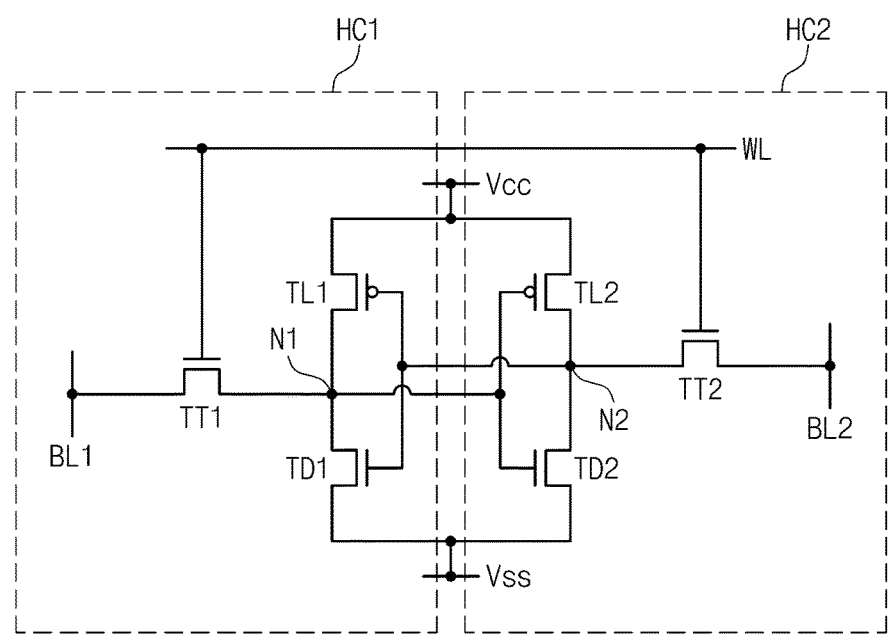
FIG. 8 is an equivalent circuit diagram illustrating a CMOS SRAM cell including a semiconductor device according to example embodiments of the inventive concept.

FIG. 8 is an equivalent circuit diagram illustrating a CMOS SRAM cell including a semiconductor device according to example embodiments of the inventive concept.

Referring to FIG. 8, the CMOS SRAM cell may include a pair of driver transistors TD1 and TD2, a pair of transfer transistors TT1 and TT2, and a pair of load transistors TL1 and TL2. The driver transistors TD1 and TD2 may be pull-down transistors, the transfer transistors TT1 and TT2 may be pass transistors, and the load transistors TL1 and TL2 may be pull-up transistors. The driver transistors TD1 and TD2 and the transfer transistors TT1 and TT2 may be NMOS transistors, and the load transistors TL1 and TL2 may be PMOS transistors. At least one of the driver and load transistors TD1, TD2, TL1, and TL2 may be provided in the form of the field effect transistor according to example embodiments of the inventive concept.

The first driver transistor TD1 and the first transfer transistor TT1 may be connected in series to each other. A source region of the first driver transistor TD1 may be electrically connected to a ground line Vss, and a drain region of the first transfer transistor TT1 may be electrically connected to a first bit line BL1. The second driver transistor TD2 and the second transfer transistor TT2 may be connected in series to each other. A source region of the second driver transistor TD2 may be electrically connected to the ground line Vss, and a drain region of the second transfer transistor TT2 may be electrically connected to a second bit line BL2.

Source and drain regions of the first load transistor TL1 may be electrically connected to a power line Vcc and a drain region of the first driver transistor TD1, respectively. Source and drain regions of the second load transistor TL2 may be electrically connected to the power line Vcc and a drain region of the second driver transistor TD2, respectively. The drain region of the first load transistor TL1, the drain region of the first driver transistor TD1, and a source region of the first transfer transistor TT1 may serve as a first node N1. The drain region of the second load transistor TL2, the drain region of the second driver transistor TD2, and a source region of the second transfer transistor TT2 may serve as a second node N2. Gate electrodes 140 of the first driver transistor TD1 and the first load transistor TL1 may be electrically connected to the second node N2, and gate electrodes 140 of the second driver transistor TD2 and the second load transistor TL2 may be electrically connected to the first node N1. Gate electrodes 140 of the first and second transfer transistors TT1 and TT2 may be electrically connected to a word line WL. The first driver transistor TD1, the first transfer transistor TT1, and the first load transistor TL1 may constitute a first half cell HC1, while the second driver transistor TD2, the second transfer transistor TT2, and the second load transistor TL2 may constitute a second half cell HC2.

Example embodiments of the inventive concept may not be limited to the example of SRAM, and may be applied or modified to realize a logic device, DRAM, MRAM, and fabricating methods thereof.

Figure 9:
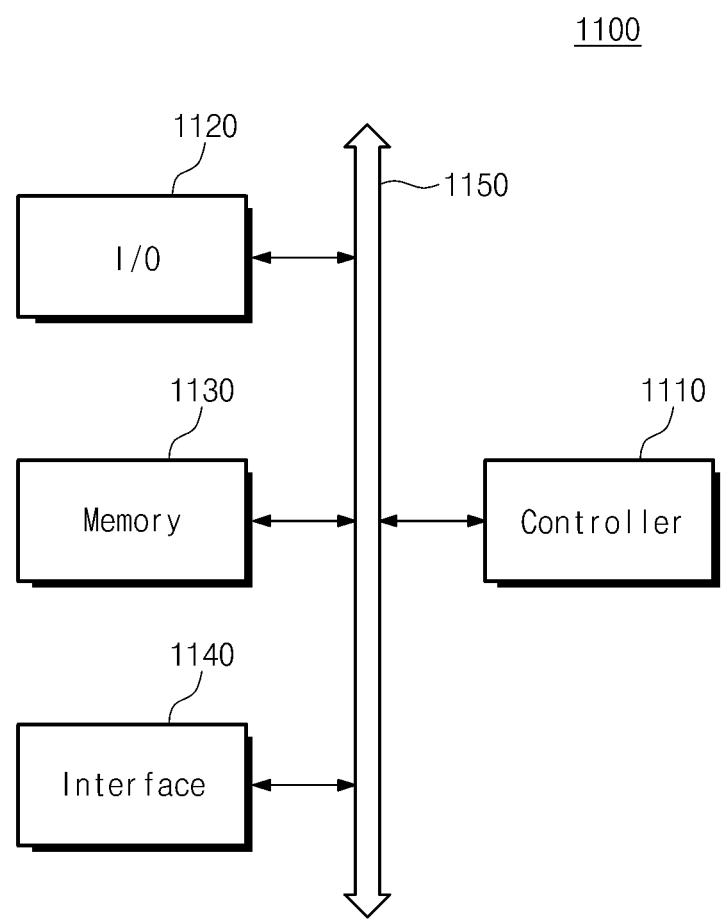
FIG. 9 is a schematic block diagram illustrating an example of electronic systems including a semiconductor device according to example embodiments of the inventive concept.
Figure 10:
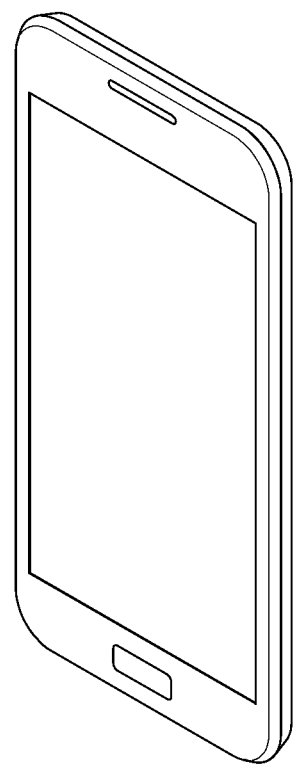

FIG. 9 is a schematic block diagram illustrating an example of electronic systems including a semiconductor device according to example embodiments of the inventive concept.

Referring to FIG. 9, an electronic system 1100 may include a controller 1110, an input-output (I/O) unit 1120, a memory device 1130, an interface 1140, and a bus 1150. The controller 1110, the input-output unit 1120, the memory device 1130 and/or the interface 1140 may be connected or coupled to each other via the bus 1150 serving as a pathway for data communication.

The controller 1110 may include, e.g., at least one of a microprocessor, a digital signal processor, a microcontroller, or another logic device. The other logic device may have a similar function to any one of the microprocessor, the digital signal processor, and the microcontroller. The input-output unit 1120 may include a keypad, keyboard, a display device, and so forth. The memory device 1130 may be configured to store data and/or command. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast DRAM device and/or a fast SRAM device which acts as a cache memory for improving an operation of the controller 1110. A semiconductor device according to example embodiments of the inventive concept may be provided to form the memory device 1130 or as a part of the controller 1110 and/or the I/O unit 1120.

The electronic system 1100 may be applied to an electronic device such as, for example, a personal digital assistant (PDA), a portable computer, a web tablet, a wireless phone, a mobile phone, a digital music player, a memory card, or other electronic products. The other electronic products may receive or transmit information data by wireless.

The electronic system 1100 of FIG. 9 can be applied to realize various electronic devices.

Figure 10:
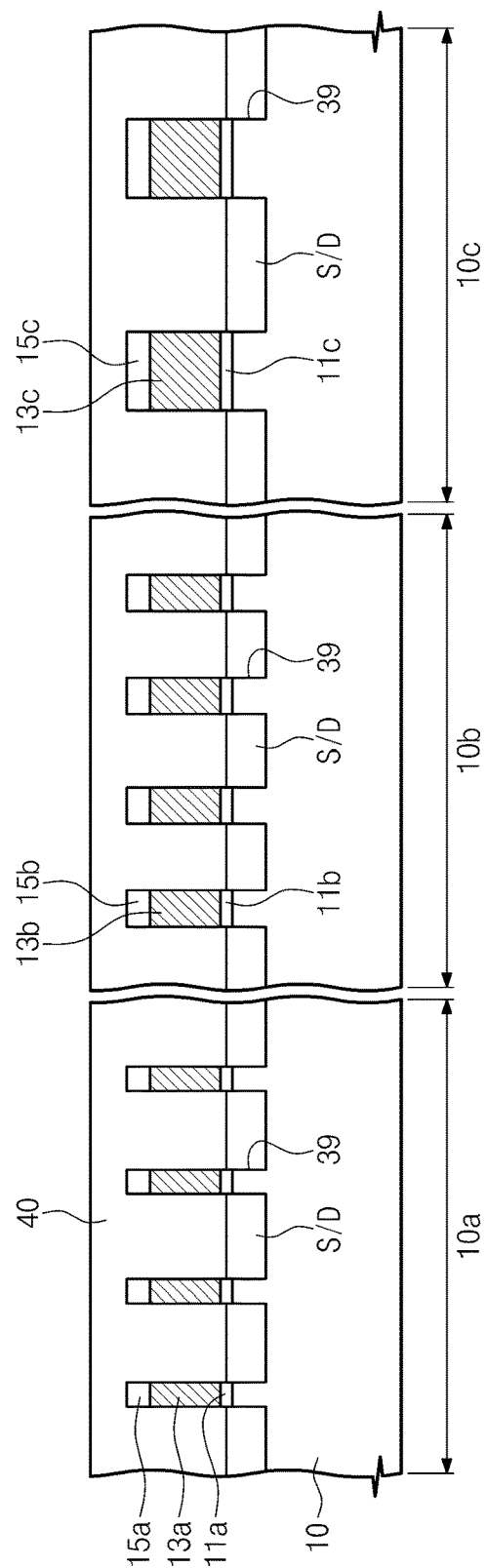
FIG. 10 is a perspective view of a mobile phone, which is illustrated as an example of an electronic system according to example embodiments of the inventive concept.

FIG. 10 is a schematic view illustrating an example of various electronic devices, to which the electronic system 1100 of FIG. 9 can be applied. As shown in FIG. 10, the electronic system 1100 of FIG. 9 can be applied to realize a mobile phone 1200. However, it will be understood that, in other embodiments, the electronic system 1100 of FIG. 9 may be applied to portable notebook computers, MP3 players, navigators, solid state disks (SSDs), automobiles, and/or household appliances.

According to example embodiments of the inventive concept, first and second spacers may be formed to have convexly-curved sidewalls, and thus, the first and second spacers may not be directly used as an etch mask for forming fine patterns. For example, the first and second spacers may be used as an etch mask for forming first and second upper patterns, which will be used as the etch mask for forming the fine patterns on a substrate. This makes it possible to form fine patterns, which have the same widths as the first and second spacers, and whose top corners are shaped to have a sharp profile.

While example embodiments of the inventive concepts have been particularly shown and described, it will be understood by one of ordinary skill in the art that variations in form and detail may be made therein without departing from the spirit and scope of the attached claims.

What is claimed is:

1. A method of fabricating a semiconductor device, comprising:
sequentially forming a lower layer and an upper layer on a substrate;
forming, on the upper layer, a first set of sacrificial patterns at a first region of the substrate and a second set of sacrificial patterns at a second region of the substrate;
forming first spacers on sidewalls of the first set of sacrificial patterns and second spacers on sidewalls of the second set of sacrificial patterns;
selectively removing the first set of sacrificial patterns and the second set of sacrificial patterns;
etching the upper layer exposed by the first and second spacers to form a first set of upper patterns and a second set of upper patterns under the respective first spacers and second spacers;
removing the first spacers and second spacers to expose top surfaces of the first and second sets of upper patterns;
forming third spacers on sidewalls of the second set of upper patterns, wherein each pattern of the first set of upper patterns has a first width, and each pattern of the second set of upper patterns and its corresponding third spacers has a second width greater than the first width; and
etching the lower layer to form a first set of lower patterns at the first region and a second set of lower patterns at the second region,
wherein each pattern of the first set of lower patterns has the first width, and each pattern of the second set of lower patterns has the second width.

2. The method of claim 1, further comprising, after forming the third spacers on sidewalls of the second set of upper patterns, and before etching the lower layer to form a first set of lower patterns at the first region and a second set of lower patterns at the second region:
etching a buffer layer disposed between the upper patterns and the lower layer; and
using the etched buffer layer as a mask to etch the lower layer and form the first and second set of lower patterns.

3. The method of claim 2,
wherein the etched buffer layer includes a first set of buffer patterns formed under the first set of upper patterns using the first set of upper patterns as an etch mask, and the etched buffer layer includes a second set of buffer patterns formed under the second set of upper patterns and the third spacers using the second set of upper patterns and the third spacers as an etch mask,
wherein each buffer pattern of the second set of buffer patterns is formed to have the second width, and each buffer pattern of the first set of buffer patterns is formed to have the first width.

4. The method of claim 1, further comprising:
forming a set of first fins on the substrate, each first fin corresponding to a lower pattern of the first set of lower patterns, and each first fin having the first width; and
forming a set of second fins on the substrate, each second fin corresponding to a lower pattern of the second set of lower patterns, and each second fin having the second width.

5. The method of claim 4, wherein each fin of the first set of fins and the second set of fins is part of a transistor and includes a gate electrode formed thereon.

6. A method of fabricating a semiconductor device, comprising:
sequentially forming a lower layer and an upper layer on a substrate;
forming, on the upper layer, a first set of sacrificial patterns at a first region of the substrate and a second set of sacrificial patterns at a second region of the substrate;
forming first spacers on opposite sidewalls of each sacrificial pattern of the first set of sacrificial patterns and second spacers on opposite sidewalls of each sacrificial pattern of the second set of sacrificial patterns;
selectively removing the first set of sacrificial patterns and the second set of sacrificial patterns without removing the first or second spacers, thereby exposing part of the upper layer;
etching the upper layer exposed by the first and second spacers to form a first set of upper patterns and a second set of upper patterns under the respective first spacers and second spacers;
removing the first spacers and second spacers to expose top surfaces of the first and second sets of upper patterns;
forming third spacers on opposite sidewalls of each upper pattern of the first set of upper patterns, wherein each pattern of the first set of upper patterns has a first width, and each pattern of the second set of upper patterns and its corresponding third spacers has a second width greater than the first width; and
etching the lower layer using the first set of upper patterns, and the second set of upper patterns and corresponding third spacers to form first fins of the first region on the substrate, the first fins having the first width, and to form second fins of the second region on the substrate, the second fins having the second width.

* * * * *